US012740401B2

(12) United States Patent
Kim et al.

(10) Patent No.: US 12,740,401 B2
(45) Date of Patent: Sep. 15, 2026

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Ki-Il Kim, Suwon-si (KR); Jisoo Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 361 days.

(21) Appl. No.: 18/587,425

(22) Filed: Feb. 26, 2024

(65) Prior Publication Data

US 2025/0070021 A1 Feb. 27, 2025

(30) Foreign Application Priority Data

Aug. 24, 2023 (KR) ........................ 10-2023-0111436

(51) Int. Cl.

| | |
|---|---|
| ***H10W 20/41*** | (2026.01) |
| ***H10D 30/43*** | (2025.01) |
| ***H10D 30/67*** | (2025.01) |
| ***H10D 62/10*** | (2025.01) |
| ***H10D 84/85*** | (2025.01) |
| ***H10W 20/42*** | (2026.01) |

(52) U.S. Cl.

CPC .......... *H10W 20/435* (2026.01); *H10D 30/43* (2025.01); *H10D 30/6735* (2025.01); *H10D 30/6757* (2025.01); *H10D 62/121* (2025.01); *H10D 84/85* (2025.01); *H10W 20/42* (2026.01)

(58) Field of Classification Search

CPC .... H10W 20/435; H10W 20/42; H10D 30/43; H10D 30/6735; H10D 30/6757; H10D 62/121; H10D 84/85

See application file for complete search history.

(56) References Cited

U.S. PATENT DOCUMENTS

| | | | |
|---|---|---|---|
| 5,658,829 | A | 8/1997 | Matthews et al. |
| 6,451,181 | B1 | 9/2002 | Denning et al. |
| 6,812,147 | B2 | 11/2004 | Skinner et al. |
| 7,282,444 | B2 | 10/2007 | Tanida et al. |
| 7,759,251 | B2 | 7/2010 | Geffken et al. |

(Continued)

FOREIGN PATENT DOCUMENTS

| | | |
|---|---|---|
| JP | 2005-167093 A | 6/2005 |

*Primary Examiner* — Samuel A Gebremariam
(74) *Attorney, Agent, or Firm* — Sughrue Mion, PLLC

(57) ABSTRACT

Provided is a semiconductor device and method of manufacturing same. The semiconductor device includes: a transistor on a substrate; a first wiring layer on the transistor, the first wiring layer including a first wiring electrically connected to the transistor; and a second wiring layer on the first wiring layer, the second wiring layer including an interlayer insulating layer and a second wiring provided in the interlayer insulating layer, wherein the second wiring includes a line structure and a first via structure, wherein the first via structure vertically connects the line structure and the first wiring, wherein the first via structure includes: a first outer surface in contact with the interlayer insulating layer; and a second outer surface in contact with the interlayer insulating layer and facing a direction opposite from the first outer surface, wherein the first outer surface and the second outer surface are curved surfaces, and wherein a curvature of the first outer surface and a curvature of the second outer surface are different from each other.

20 Claims, 39 Drawing Sheets

(56) References Cited

U.S. PATENT DOCUMENTS

| | | | |
|---|---|---|---|
| 7,781,892 | B2 | 8/2010 | Chen et al. |
| 9,406,589 | B2 | 8/2016 | Ting |
| 9,934,981 | B2 | 4/2018 | Sherman et al. |
| 10,068,798 | B2 | 9/2018 | Toshima et al. |
| 10,173,916 | B2 | 1/2019 | Bankaitis et al. |
| 10,741,441 | B2 | 8/2020 | Li et al. |
| 2009/0098729 | A1 | 4/2009 | Jang |

Figure 21:
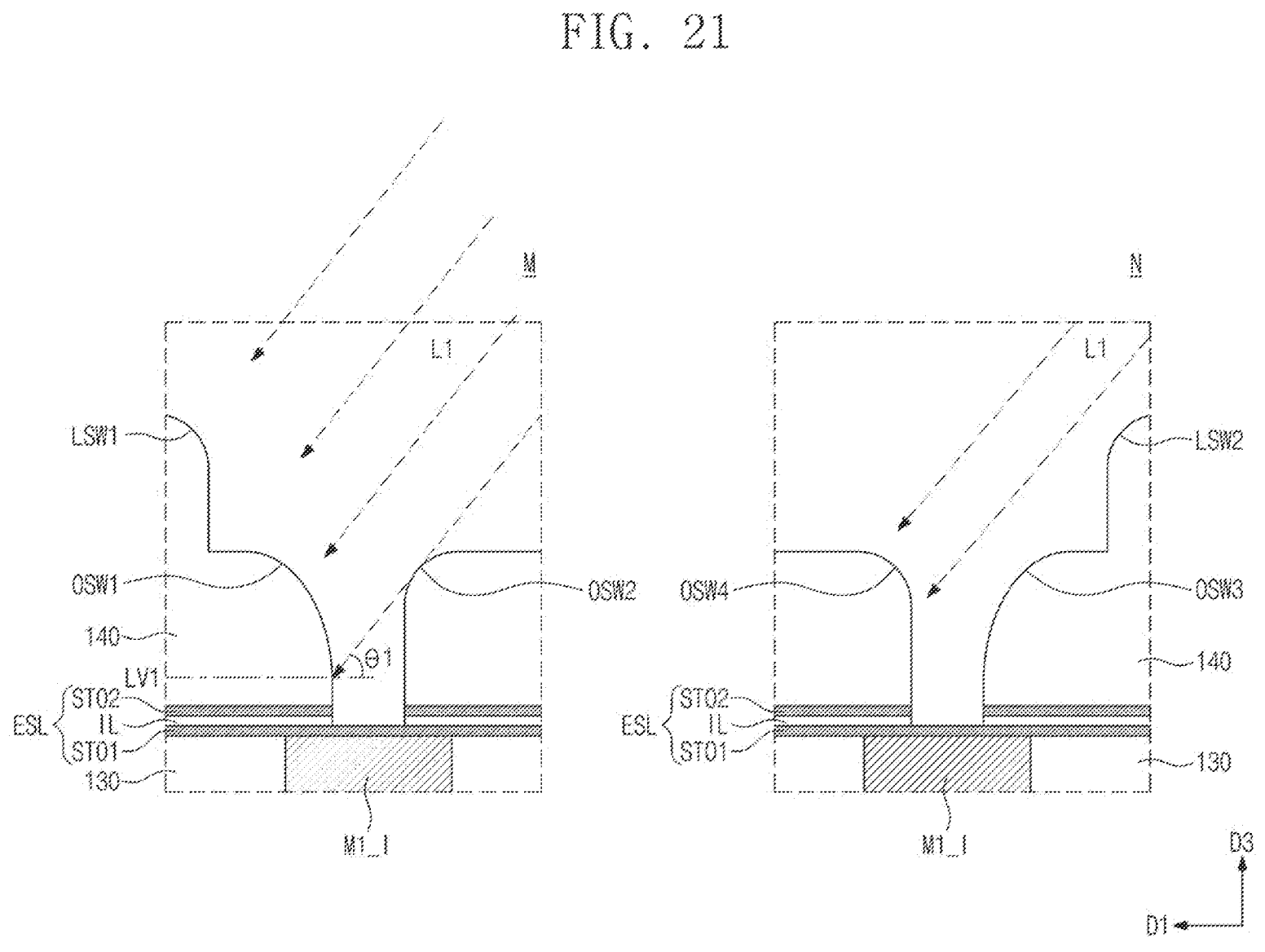

LSW1

LSW2

OSW1

OSW2

OSW3

OSW4

θ1

140

130

LV1

M1_I

ESL

STO2

IL

STO1

D1

D3

M
N
LTH
VH1
VH2
LSW1
LSW2
OSW1
OSW2
OSW3
OSW4
MBP
140
130
LV1
LV2
LV3
LV4
ESL
STO2
IL
STO1
M1_I

SEMICONDUCTOR DEVICE AND METHOD OF MANUFACTURING THE SAME

CROSS-REFERENCE TO RELATED APPLICATIONS

This U.S. non-provisional patent application is based on and claims priority to Korean Patent Application No. 10-2023-0111436, filed on Aug. 24, 2023, in the Korean Intellectual Property Office, the entire contents of which are hereby incorporated by reference.

BACKGROUND

1. Field

The disclosure relates to a semiconductor device and a method of manufacturing the same, and more particularly, relates to a semiconductor device including a field effect transistor and a method of manufacturing the same.

2. Description of Related Art

A semiconductor device may include an integrated circuit including metal-oxide-semiconductor field effect transistors (MOSFET). As sizes and design rules of semiconductor devices have been reduced, sizes of MOSFET have also been scaled down. Operating characteristics of semiconductor devices may be deteriorated by the scale down of the MOSFET. Thus, research is being conducted for semiconductor devices capable of overcoming limitations caused by a high integration density and of improving performance.

SUMMARY

The disclosure provides a semiconductor device with improved electrical characteristics and a method of manufacturing the same.

According to an aspect of the disclosure, a semiconductor device includes: a transistor on a substrate; a first wiring layer on the transistor, the first wiring layer including a first wiring electrically connected to the transistor; and a second wiring layer on the first wiring layer, the second wiring layer including an interlayer insulating layer and a second wiring provided in the interlayer insulating layer, wherein the second wiring includes a line structure and a first via structure, wherein the first via structure vertically connects the line structure and the first wiring, wherein the first via structure includes: a first outer surface in contact with the interlayer insulating layer; and a second outer surface in contact with the interlayer insulating layer and facing a direction opposite from the first outer surface, wherein the first outer surface and the second outer surface are curved surfaces, and wherein a curvature of the first outer surface and a curvature of the second outer surface are different from each other.

According to an aspect of the disclosure, a semiconductor device includes: a transistor on a substrate; a first wiring layer on the transistor, the first wiring layer including a first wiring electrically connected to the transistor; and a second wiring layer on the first wiring layer, the second wiring layer including an interlayer insulating layer and a second wiring provided in the interlayer insulating layer, wherein the second wiring includes a line structure and a first via structure, wherein the first via structure connects the line structure and the first wiring in a first direction, wherein the via structure includes: a first portion in contact with a first surface of the interlayer insulating layer; and a second portion in contact with a second surface of the interlayer insulating layer, the second surface facing the first surface, and the second portion spaced apart from the first portion in a second direction perpendicular to the first direction, wherein the first surface and the second surface are curved surfaces, and wherein a lowest level of the first portion is lower than a lowest level of the second portion.

According to an aspect of the disclosure, a semiconductor device includes: a transistor on a substrate; a first wiring layer on the transistor, the first wiring layer including a first wiring electrically connected to the transistor; a second wiring layer on the first wiring layer, the second wiring layer including an interlayer insulating layer and a second wiring provided in the interlayer insulating layer; and an etch stop layer interposed between the first wiring layer and the second wiring layer, wherein the second wiring includes: a line structure provided on an upper portion of the second wiring layer; and a plurality of via structures vertically connecting the line structure and the first wiring, wherein the plurality of via structures include first via structures and second via structures adjacent to each other, wherein the first via structure includes: a first outer surface including a curved surface in contact with the interlayer insulating layer; and a second outer surface including a curved surface in contact with the interlayer insulating layer and facing a direction opposite from the first outer surface, wherein the second via structure includes: a third outer surface comprising a curved surface in contact with the interlayer insulating layer; and a fourth outer surface including a curved surface in contact with the interlayer insulating layer and facing in a direction opposite from the third outer surface, and wherein a curvature of the first outer surface is different from a curvature of the third outer surface.

BRIEF DESCRIPTION OF DRAWINGS

The above and other aspects, features, and advantages of certain embodiments of the present disclosure will be more apparent from the following description taken in conjunction with the accompanying drawings, in which:

FIG. 6 is an enlarged view illustrating region "M" and region "N" of FIG. 5C;

FIGS. 13 through 24 are views for illustrating the method of forming FIG. 6.

DETAILED DESCRIPTION

Figure 1:
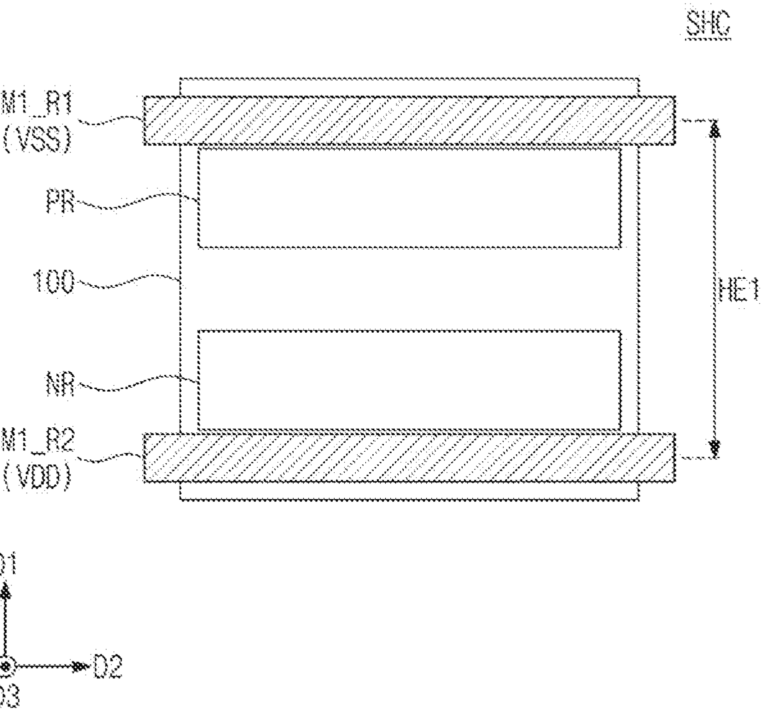
FIGS. 1, 2 and 3 are conceptual diagrams for illustrating logic cells of a semiconductor device according to one or more embodiments of the disclosure.

In the following description, like reference numerals refer to like elements throughout the specification. Well-known functions or constructions are not described in detail since they would obscure the one or more exemplar embodiments with unnecessary detail.

It will be understood that when an element is referred to as being "connected" with or to another element, it can be directly or indirectly connected to the other element.

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

Herein, the expression "at least one of a, b or c" indicates "only a," "only b," "only c," "both a and b," "both a and c," "both b and c," or "all of a, b, and c."

It will be understood that, although the terms first, second, third, etc., may be used herein to describe various elements, is the disclosure should not be limited by these terms. These terms are only used to distinguish one element from another element.

As used herein, the singular forms "a," "an" and "the" are intended to include the plural forms as well, unless the context clearly indicates otherwise.

Figure 2:
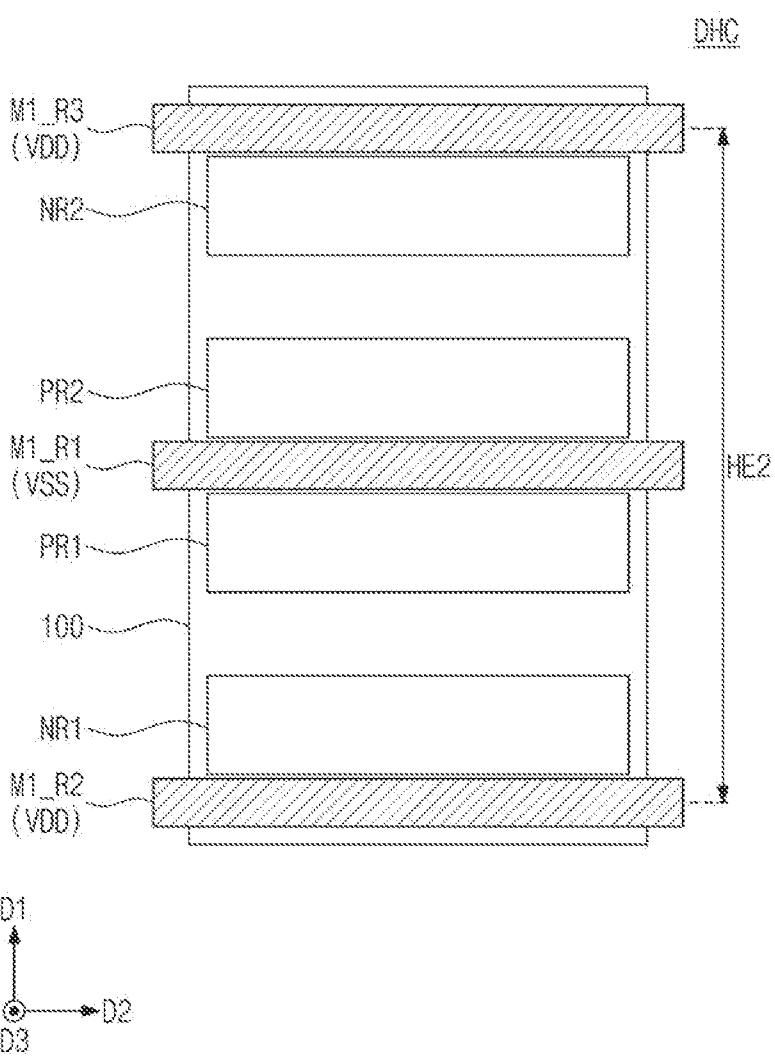
Figure 3:
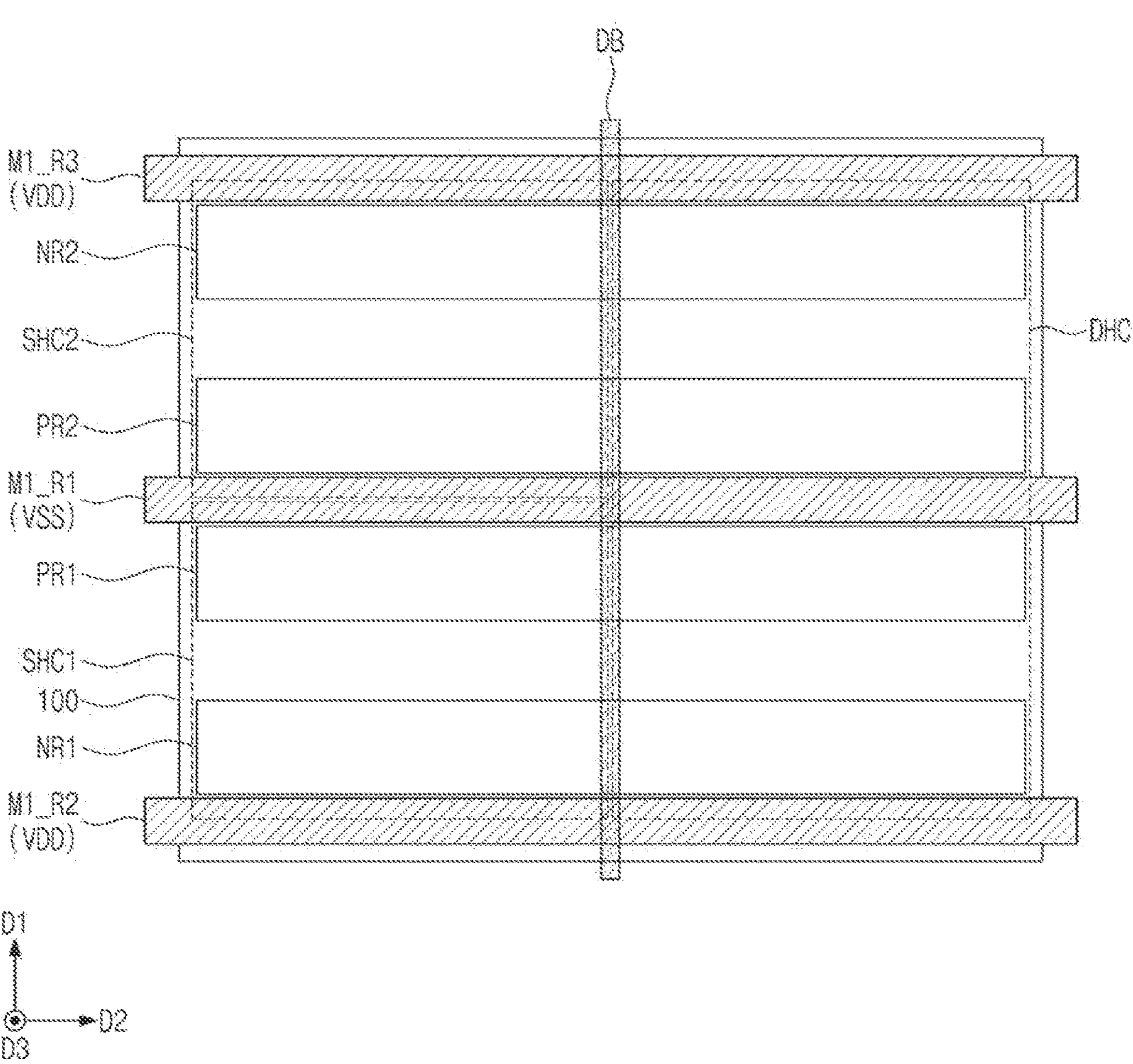

FIGS. 1 to 3 are conceptual diagrams for illustrating logic cells of a semiconductor device according to embodiments of the disclosure.

Referring to FIG. 1, a single height cell SHC may be provided. In detail, a substrate 100 may be provided thereon with a first power line M1_R1 and a second power line M1_R2. The first power line M1_R1 may be a path for providing a source voltage VSS, for example, a ground voltage. The second power line M1_R2 may be a path for providing a drain voltage VDD, for example, a power voltage.

The single height cell SHC may be defined between the first power line M1_R1 and the second power line M1_R2. The single height cell SHC may include one PMOSFET region PR and one NMOSFET region NR. That is, the single height cell SHC may have a CMOS structure provided between the first power line M1_R1 and the second power line M1_R2.

Each of the PMOSFET and NMOSFET regions PR and NR may have a first width WI1 in a first direction D1. A first height HE1 may be defined as a length in the first direction D1 of the single height cell SHC. The first height HE1 may be the same or substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device and wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a drain voltage VDD.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A second height HE2 may be defined as a length in the first direction D1 of the double height cell DHC. The second height HE2 may be about twice the first height HE1 of FIG. 1. The first and second PMOSFET regions PR1 and PR2 of the double height cell DHC may collectively operate as a single PMOSFET region.

Therefore, the double height cell DHC may have a PMOS transistor whose channel size is greater than that of a PMOS transistor included in the single height cell SHC discussed above in FIG. 1. For example, the channel size of the PMOS transistor included in the double height cell DHC may be about twice that of the PMOS transistor included in the single height cell SHC. In conclusion, the double height cell DHC may operate at a higher speed than that of the single height cell SHC. In the present disclosures, the double height cell DHC shown in FIG. 2 may be defined as a multi-height cell. The multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally arranged. The first single height cell SHC1 may be disposed between a first power line M1_R1 and a second power line M1_R2. The second single height cell SHC2 may be disposed between the first power line M1_R1 and a third power line M1_R3. The second single height cell SHC2 may be adjacent in the first direction D1 to the first single height cell SHC1.

The double height cell DHC may be disposed between the second power line M1_R2 and the third power line M1_R3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
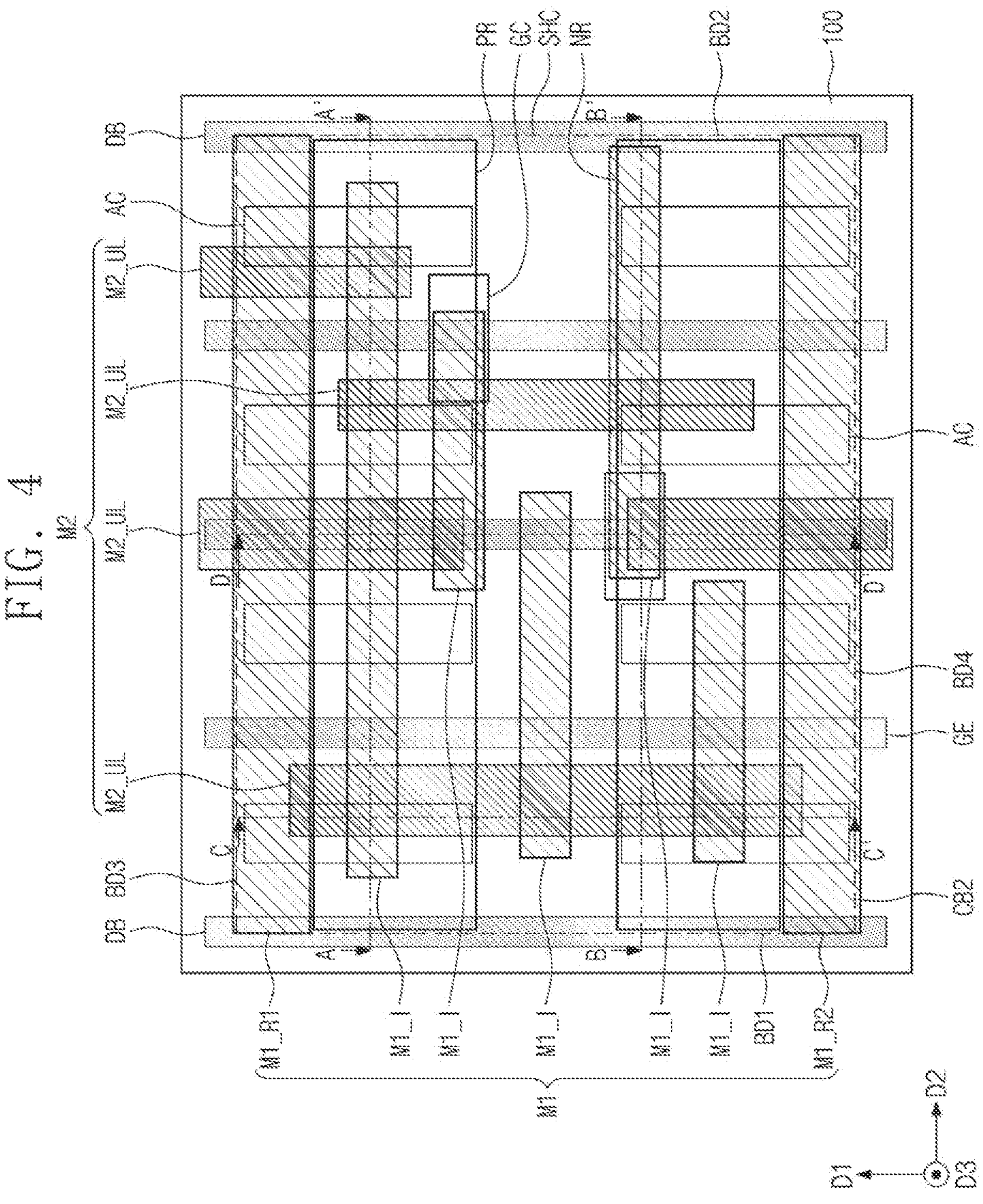
FIG. 4 is a plan view for illustrating a semiconductor device according to one or more embodiments of the disclosure.

FIG. 4 is a plan view for illustrating a semiconductor device according to one or more embodiments of the disclosure. FIGS. 5A to 5D are cross-sectional views taken along lines A-A', B-B', C-C', and D-D' of FIG. 4, respectively. A semiconductor device illustrated in FIGS. 4 and 5A to 5D is a detailed example of the single height cell SHC of FIG. 1.

Referring to FIGS. 4 and 5A to 5D, a single height cell SHC may be provided on the substrate 100. Logic transistors constituting a logic circuit may be disposed on a single height cell SHC. The substrate 100 may be a semiconductor substrate containing silicon, germanium, silicon-germanium, and so on, or a compound semiconductor substrate. As an example, the substrate 100 may be a silicon substrate.

A first active pattern AP1 and a second active pattern AP2 may be defined by a trench TR formed on an upper portion of the substrate 100. The first active pattern AP1 may be provided on a PMOSFET region PR, and the second active pattern AP2 may be provided on an NMOSFET region NR. The first and second active patterns AP1 and AP2 may extend in a second direction D2. The first and second active patterns AP1 and AP2 may be a portion of the substrate 100 and may be vertically protruding portions.

A device isolation layer ST may be provided on the substrate 100. The device isolation layer ST may fill the trench TR. The device isolation layer ST may include a silicon oxide layer. The device isolation layer ST may not cover first and second channel patterns CH1 and CH2, which will be described later.

A first channel pattern CH1 may be provided on the first active pattern AP1. A second channel pattern CH2 may be provided on the second active pattern AP2. Each of the first channel pattern CH1 and the second channel pattern CH2 may include a first semiconductor pattern SP1, a second semiconductor pattern SP2, and a third semiconductor pattern SP3 sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may include silicon (Si), germanium (Ge), or silicon-germanium (SiGe). For example, each of the first to third semiconductor patterns SP1, SP2, and SP3 may include crystalline silicon. In one or more embodiments of the disclosure, the first to third semiconductor patterns SP1, SP2, and SP3 may be stacked nanosheets.

A plurality of first source/drain patterns SD1 may be provided on the first active pattern AP1. A plurality of first recesses RS1 may be formed on the first active pattern AP1. The first source/drain patterns SD1 may be provided in the first recesses RS1, respectively. The first source/drain patterns SD1 may be impurity regions of a first conductivity type (e.g., p-type). A first channel pattern CH1 may be interposed between a pair of first source/drain patterns SD1. That is, the stacked first to third semiconductor patterns SP1, SP2, and SP3 may connect a pair of first source/drain patterns SD1 to each other.

A plurality of second source/drain patterns SD2 may be provided on the second active pattern AP2. A plurality of second recesses RS2 may be formed on the second active pattern AP2. The second source/drain patterns SD2 may be provided in the second recesses RS2, respectively. The second source/drain patterns SD2 may be impurity regions of a second conductivity type (e.g., n-type). A second channel pattern CH2 may be interposed between a pair of second source/drain patterns SD2. That is, the stacked first to third semiconductor patterns SP1, SP2, and SP3 may connect a pair of second source/drain patterns SD2 to each other.

The first and second source/drain patterns SD1 and SD2 may be epitaxial patterns formed through a selective epitaxial growth (SEG) process. For example, an upper surface of each of the first and second source/drain patterns SD1 and SD2 may be higher than an upper surface of the third semiconductor pattern SP3. As another example, the upper surface of at least one of the first and second source/drain patterns SD1 and SD2 may be positioned at substantially the same level as the upper surface of the third semiconductor pattern SP3.

In one or more embodiments of the disclosure, the first source/drain patterns SD1 may include a semiconductor element (e.g., SiGe) having a lattice constant greater than a lattice constant of a semiconductor element of the substrate 100. Accordingly, the pair of first source/drain patterns SD1 may provide compressive stress to the first channel pattern CH1 therebetween. The second source/drain patterns SD2 may include the same semiconductor element (e.g., Si) as that of the substrate 100.

Sidewalls of each of the first and second source/drain patterns SD1 and SD2 may have an uneven embossed shape. That is, the sidewall of each of the first and second source/drain patterns SD1 and SD2 may have a wavy profile. The sidewalls of each of the first and second source/drain patterns SD1 and SD2 may protrude toward first to third portions PO1, PO2, and PO3 of a gate electrode GE, which will be described later.

Gate electrodes GE may be provided crossing the first and second channel patterns CH1 and CH2 and extending in a first direction D1. The gate electrodes GE may be arranged in the second direction D2 with a first pitch. Each of the gate electrodes GE may vertically overlap the first and second channel patterns CH1 and CH2.

The gate electrode GE may include first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on third semiconductor pattern SP3.

Figure 5A:
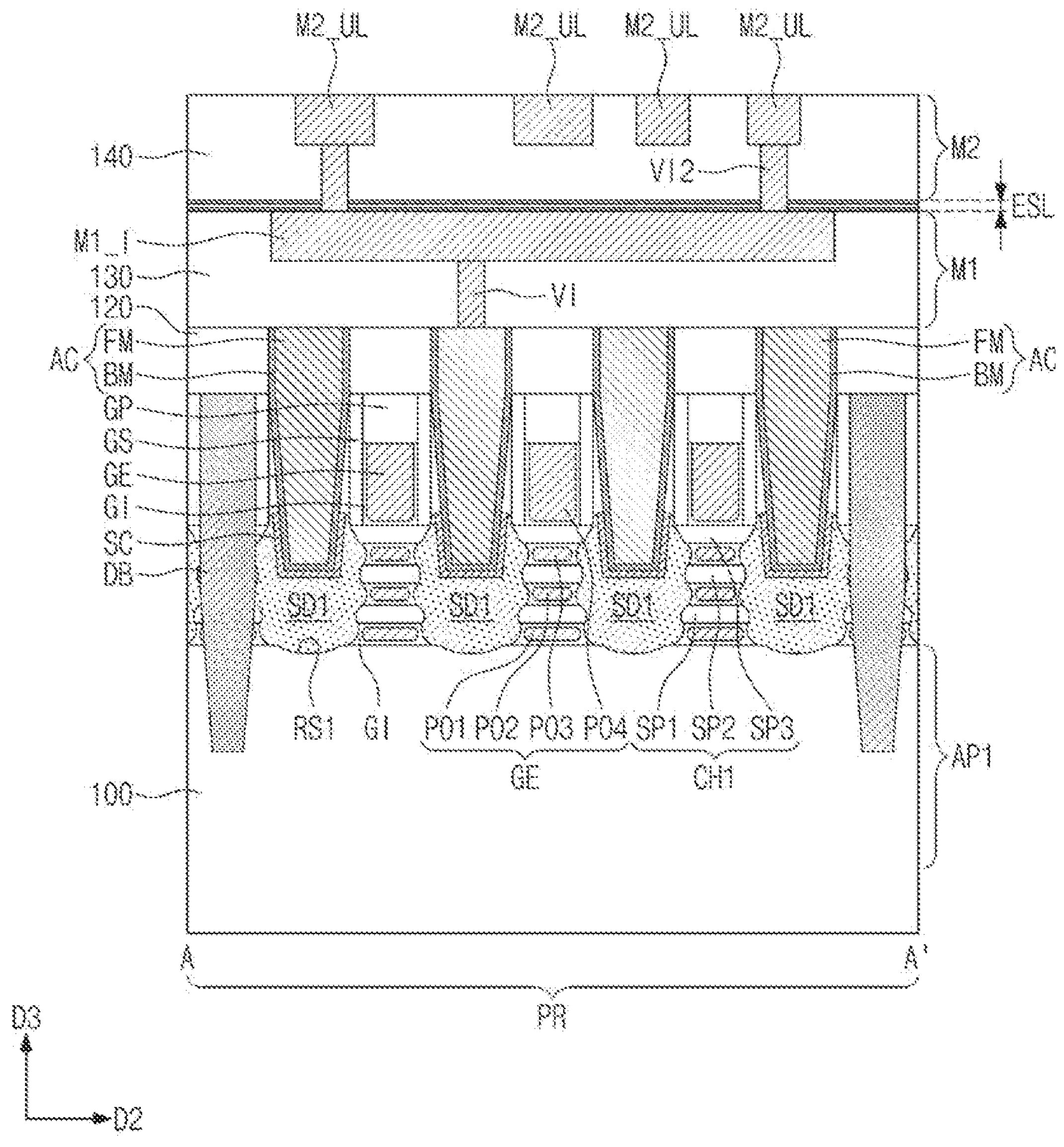
FIGS. 5A, 5B, 5C and 5D are cross-sectional views taken along lines A-A', B-B', C-C', and D-D' of FIG. 4, respectively.
Figure 5B:
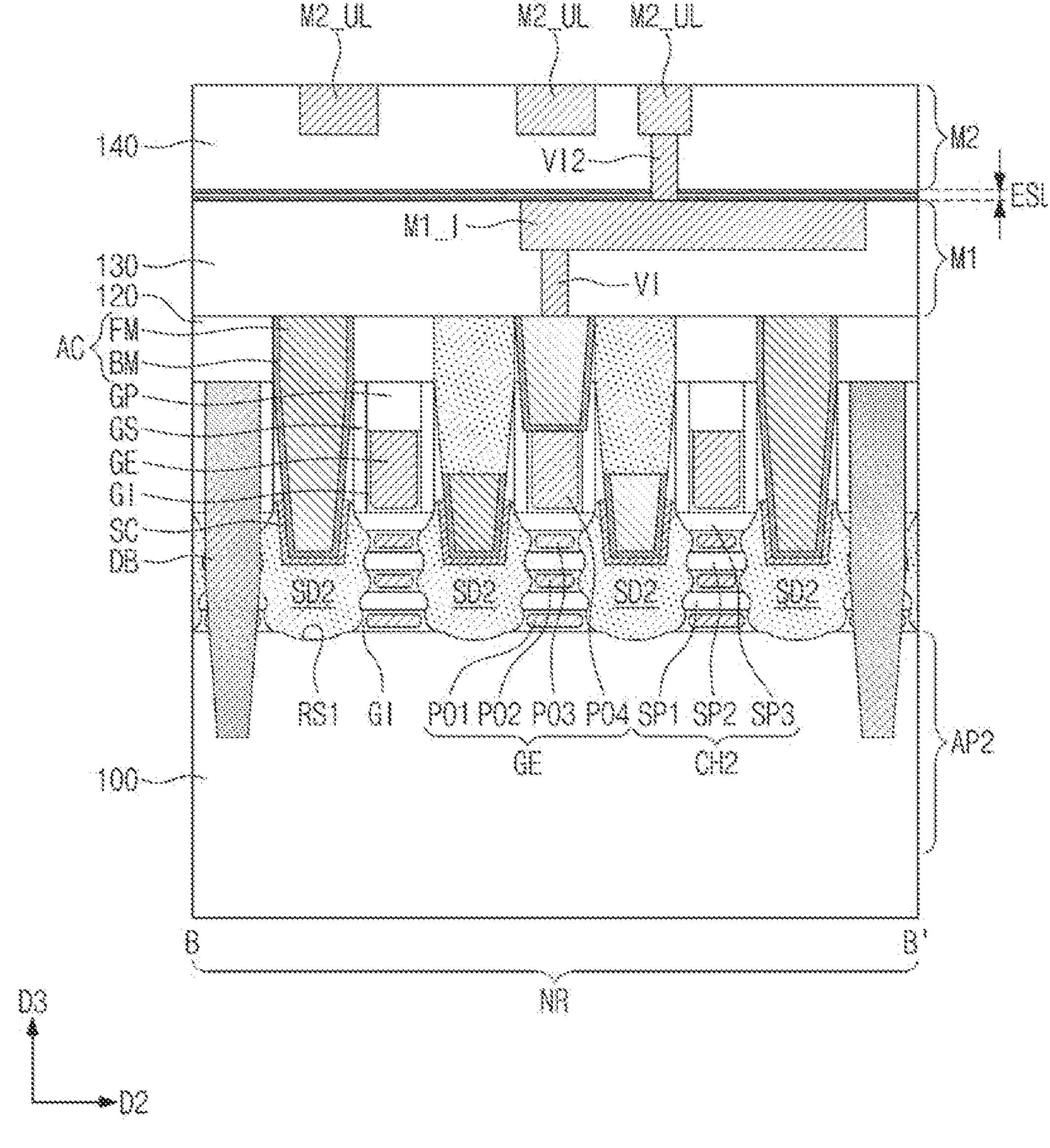
Figure 5C:
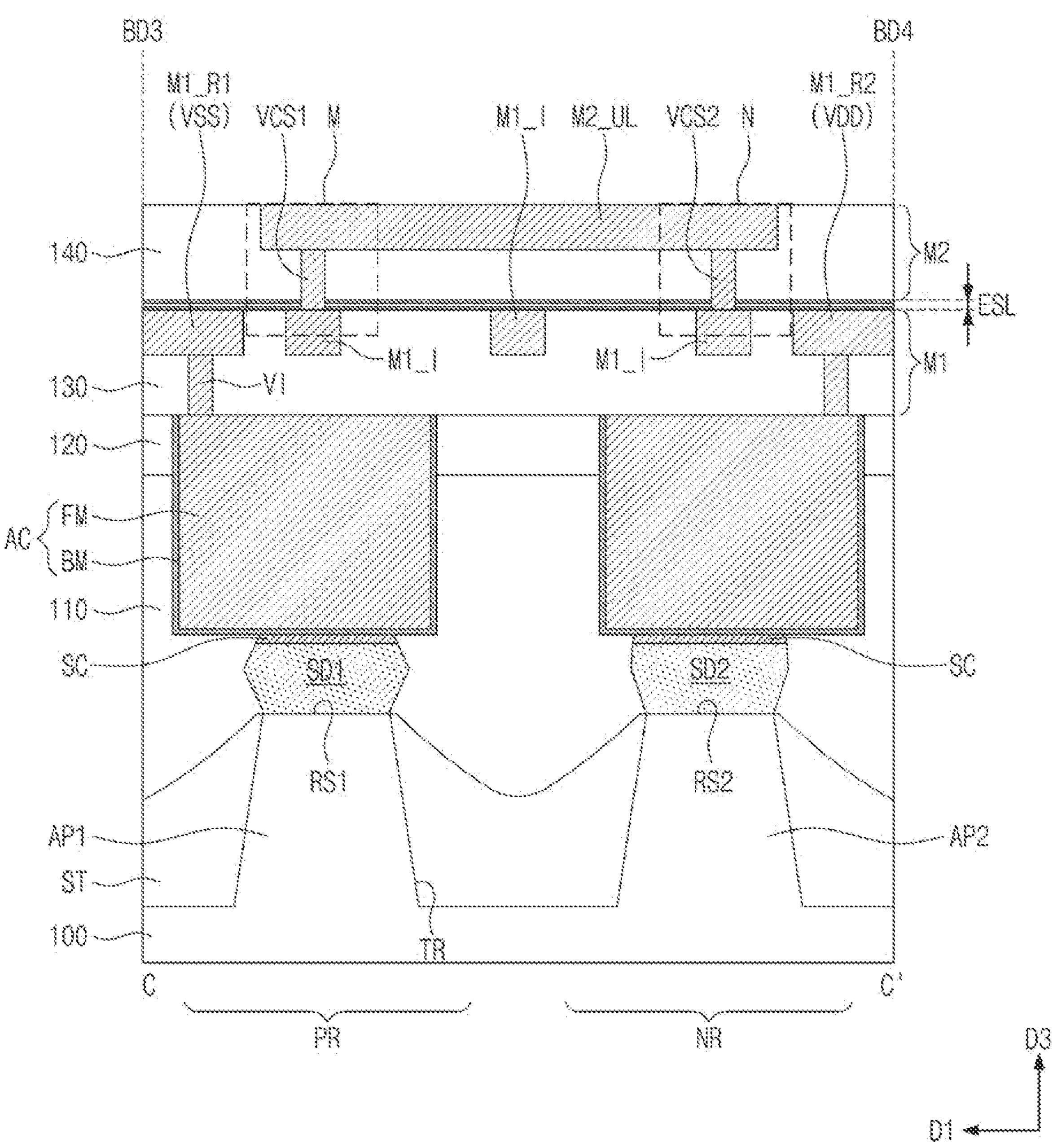
Figure 5D:
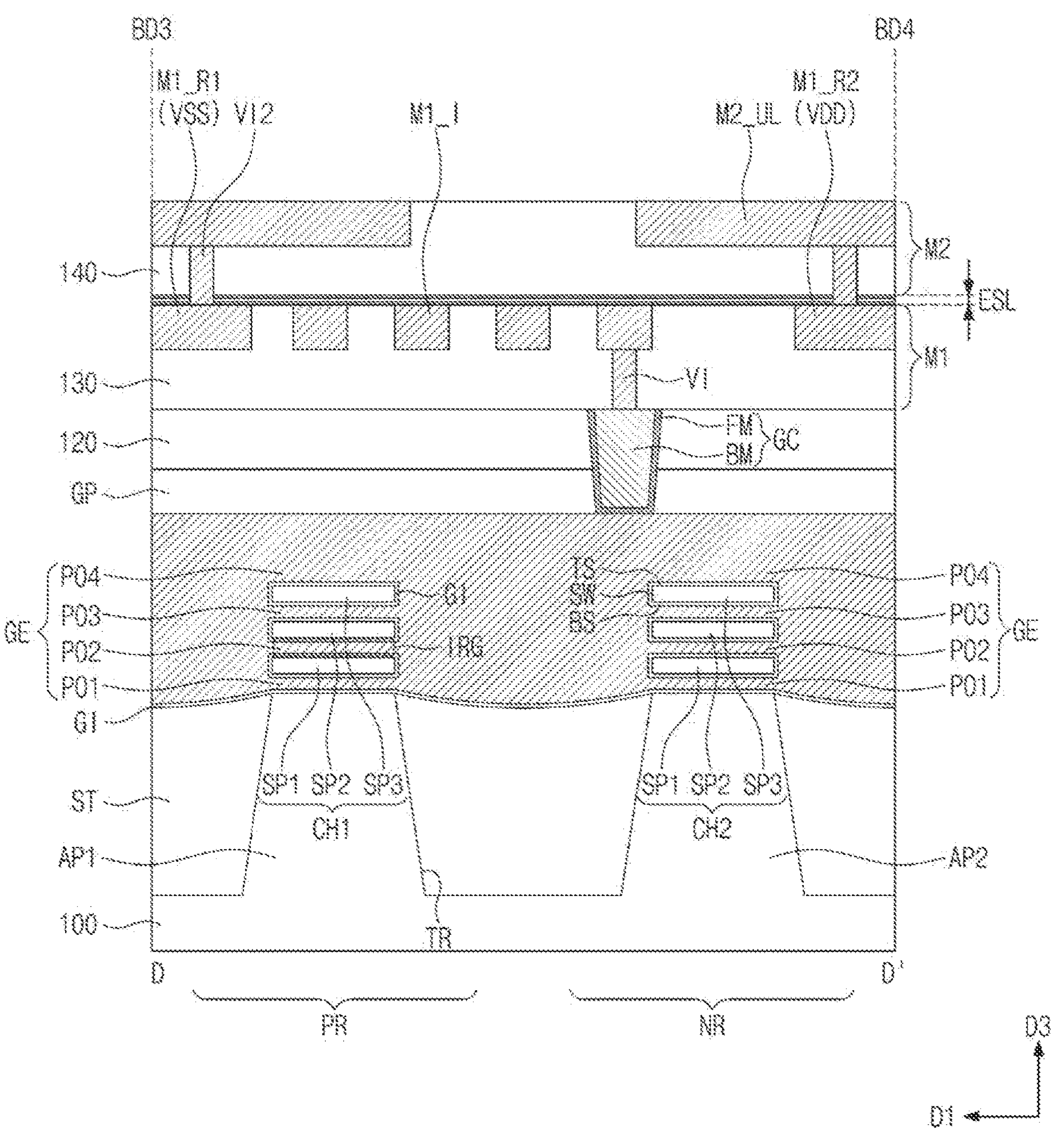

Referring to FIG. 5D, the gate electrode GE may be provided on a top surface TS, a bottom surface BS, and both side walls SW of each of the first to third semiconductor patterns SP1, SP2, and SP3. That is, the transistor according to this embodiment may be a three-dimensional field effect transistor (e.g., MBCFET or GAAFET) in which the gate electrode GE three-dimensionally surrounds the channel.

Referring again to FIGS. 4 and 5A to 5D, a pair of gate spacers GS may be disposed on both sidewalls of the fourth portion PO4 of the gate electrode GE. The gate spacers GS may extend in the first direction D1 along the gate electrode GE. Upper surfaces of the gate spacers GS may be higher than an upper surface of the gate electrode GE. The upper surfaces of the gate spacers GS may be coplanar with an upper surface of a first interlayer insulating layer 110, which will be described later. In one or more embodiments, the gate spacers GS may include at least one of SiCN, SiCON, and SiN. In another embodiment, the gate spacers GS may include a multi-layer made of at least two of SiCN, SiCON, and SiN.

A gate capping pattern GP may be provided on the gate electrode GE. The gate capping pattern GP may extend in the first direction D1 along the gate electrode GE. The gate capping pattern GP may include a material that has etch selectivity with respect to first and second interlayer insulating layers 110 and 120, which will be described later. In detail, the gate capping pattern GP may include at least one of SiON, SiCN, SiCON, and SiN.

A gate insulating layer GI may be interposed between the gate electrode GE and the first channel pattern CH1 and between the gate electrode GE and the second channel pattern CH2. The gate insulating layer GI may cover the top surface TS, bottom surface BS, and both sidewalls SW of each of the first to third semiconductor patterns SP1, SP2, and SP3. The gate insulating layer GI may cover an upper surface of the device isolation layer ST below the gate electrode GE.

In one or more embodiments of the disclosure, the gate insulating layer GI may include a silicon oxide layer, a silicon oxynitride layer, and/or a high-k dielectric layer. The high dielectric layer may include a high dielectric constant material that has a higher dielectric constant than the silicon oxide layer. As an example, the high dielectric constant material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium. oxide, lithium oxide, aluminum oxide, lead scandium tantalum oxide, and lead zinc niobate.

Referring again to FIGS. 4 and 5A to 5D, the gate electrode GE may include a first metal pattern and a second metal pattern on the first metal pattern. The first metal pattern may be provided on the gate insulating layer GI and adjacent to the first to third semiconductor patterns SP1, SP2, and SP3. The first metal pattern may include a work function metal that adjusts a threshold voltage of the transistor. By adjusting a thickness and composition of the first metal pattern, the desired threshold voltage of the transistor may be achieved. For example, the first to second portions PO1 and PO2 of the gate electrode GE may be formed of a first metal pattern that is a work function metal.

The first metal pattern may include a metal nitride layer. For example, the first metal pattern may include nitrogen (N) and at least one metal selected from the group consisting of titanium (Ti), tantalum (Ta), aluminum (Al), tungsten (W), and molybdenum (Mo). Furthermore, the first metal pattern may further include carbon (C). The first metal pattern may include a plurality of stacked work function metal layers.

The second metal pattern may include a metal with lower resistance than the first metal pattern. For example, the second metal pattern may include at least one metal selected from the group consisting of tungsten (W), aluminum (Al), titanium (Ti), and tantalum (Ta). For example, the third portion PO3 of the gate electrode GE may include a first metal pattern and a second metal pattern on the first metal pattern.

A first interlayer insulating layer 110 may be provided on the substrate 100. The first interlayer insulating layer 110 may cover the gate spacers GS and the first and second source/drain patterns SD1 and SD2. An upper surface of the first interlayer insulating layer 110 may be substantially coplanar with the upper surface of the gate capping pattern GP and the upper surface of the gate spacer GS. A second interlayer insulating layer 120 may be disposed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. As an example, the first to fourth interlayer insulating layers 110 to 140 may include a silicon oxide layer.

The single height cell SHC may have a first boundary BD1 and a second boundary BD2 facing each other in the second direction D2. The first and second boundaries BD1 and BD2 may extend in the first direction D1. The single height cell SHC may have a third boundary BD3 and a fourth boundary BD4 facing each other in the first direction D1. The third and fourth boundaries BD3 and BD4 may extend in the second direction D2.

A pair of separation structures DB facing each other in the second direction D2 may be provided on both sides of each of the first and second single height cells SHC1 and SHC2. For example, a pair of separation structures DB may be provided on the first and second boundaries BD1 and BD2 of the single height cell SHC, respectively. The separation structure DB may extend parallel to the gate electrodes GE in the first direction D1. A pitch between the separation structure DB and the gate electrode GE adjacent thereto may be the same as the first pitch.

The separation structure DB may extend through the first and second interlayer insulating layers 110 and 120 and into the first and second active patterns AP1 and AP2. The separation structure DB may penetrate an upper portion of each of the first and second active patterns AP1 and AP2. The separation structure DB may electrically separate the active region of the single height cell SHC from an active region of other adjacent cells.

Active contacts AC may be provided through the first and second interlayer insulating layers 110 and 120 and electrically connected to the first and second source/drain patterns SD1 and SD2, respectively. A pair of active contacts AC may be provided on both sides of the gate electrode GE. When viewed in a plan view, the active contact AC may have a bar shape extending in the first direction D1.

The active contact AC may be a self-aligned contact. That is, the active contact AC may be formed in a self-aligned manner using the gate capping pattern GP and the gate spacer GS. For example, the active contact AC may cover at least a portion of the sidewall of the gate spacer GS. The active contact AC may cover a portion of the upper surface of the gate capping pattern GP.

A metal-semiconductor compound layer SC, for example, a silicide layer, may be interposed between the active contact AC and the first source/drain pattern SD1 and between the active contact AC and the second source/drain pattern SD2, respectively. The active contact AC may be electrically connected to the source/drain patterns SD1 and SD2 through the metal-semiconductor compound layer SC. For example, the metal-semiconductor compound layer SC may include at least one of titanium-silicide, tantalum-silicide, tungsten-silicide, nickel-silicide, and cobalt-silicide.

Gate contacts GC may be provided through the second interlayer insulating layer 120 and the gate capping pattern GP and electrically connected to the gate electrodes GE, respectively. When viewed in a plan view, the gate contacts GC may be disposed to overlap the PMOSFET region PR and the NMOSFET region NR, respectively. As an example, the gate contact GC may be provided on the first active pattern AP1 (refer to FIG. 5D).

In one or more embodiments of the disclosure, referring to FIG. 5B, an upper portion of the active contact AC adjacent to the gate contact GC may be filled with an upper insulating pattern UIP. A bottom surface of the upper insulating pattern UIP may be lower than a bottom surface of the gate contact GC. That is, an upper surface of the active contact AC adjacent to the gate contact GC may be lowered than the bottom surface of the gate contact GC by the upper insulating pattern UIP. As a result, it is possible to prevent a short circuit occurring when the gate contact GC is in contact with the adjacent active contact AC.

Each of the active contact AC and the gate contact GC may include a conductive pattern FM and a barrier pattern BM surrounding the conductive pattern FM. For example, the conductive pattern FM may include at least one metal selected from aluminum, copper, tungsten, molybdenum, and cobalt. The barrier pattern BM may cover sidewalls and bottom surface of the conductive pattern FM. The barrier pattern BM may include a metal layer/metal nitride layer. The metal layer may include at least one of titanium, tantalum, tungsten, nickel, cobalt, and platinum. The metal nitride layer may include at least one of titanium nitride (TiN), tantalum nitride (TaN), tungsten nitride (WN), nickel nitride (NiN), cobalt nitride (CON), and platinum nitride (PtN).

A first metal layer M1 may be provided in the third interlayer insulating layer 130. For example, the first metal layer M1 may include a first power line M1_R1, a second power line M1_R2, and first wirings M1_I. Each of the wirings M1_R1, M1_R2, and M1_I of the first metal layer M1 may extend parallel to each other in the second direction D2.

In detail, the first and second power lines M1_R1 and M1_R2 may be provided on the third and fourth boundaries BD3 and BD4 of the single height cell SHC, respectively. The first power line M1_R1 may extend in the second direction D2 along the third boundary BD3. The second power line M1_R2 may extend in the second direction D2 along the fourth boundary BD4.

The first wirings M1_I of the first metal layer M1 may be disposed between the first and second power lines M1_R1 and M1_R2. The first wirings M1_I of the first metal layer M1 may be arranged in the first direction D1 with a second pitch. The second pitch may be smaller than the first pitch. A line width of each of the first wirings M1_I may be smaller than a line width of each of the first and second power lines M1_R1 and M1_R2.

The first metal layer M1 may further include first vias VI. The first vias VI may be provided under the wirings M1_R1, M1_R2, and M1_I of the first metal layer M1, respectively. The active contact AC and the wirings M1_R1, M1_R2, and M1_I of the first metal layer M1 may be electrically connected to each other through the first visa VI, respectively. The gate contact GC and the wirings M1_R1, M1_R2, and M1_I of the first metal layer M1 may be electrically connected to each other through the first vias VI, respectively.

The wirings M1_R1, M1_R2, and M1_I of the first metal layer M1 and the first vias VI therebelow may be formed through separate processes. That is, each of the wirings M1_R1, M1_R2, and M1_I of the first metal layer M1 and the first via VI may be formed through a single damascene process. The semiconductor device according to the present embodiment may be formed using a process of less than 20 nm.

A second metal layer M2 may be provided in the fourth interlayer insulating layer 140. The second metal layer M2 may include a plurality of second wirings M2_UL (also referred to herein as upper wirings M2_UL) provided in the fourth interlayer insulating layer 140. Each of the upper wirings M2_UL of the second metal layer M2 may have a line shape or a bar shape extending in the first direction D1. That is, the upper wirings M2_UL may extend parallel to each other in the first direction D1. The upper wirings M2_UL may be electrically connected to first wiring M1_I through second vias V12 (see, e.g., via structures VCS1 and VCS2 in FIGS. 5C and 6).

An etch stop layer ESL may be interposed between the third interlayer insulating layer 130 and the fourth interlayer insulating layer 140. The etch stop layer ESL may be a single layer or a multilayer. The etch stop layer ESL may be a double layer or a triple layer. The etch stop layer ESL may include stop layers and insulating layers alternately stacked with each other. For example, the etch stop layer ESL may include a first stop layer STO1, a second stop layer STO2 on the first stop layer STO1, and an insulating layer IL between the first and second stop layers STO1 and STO2.

The wirings M1_R1, M1_R2, and M1_I of the first metal layer M1 and the wiring M2_UL of the second metal layer M2 may include the same or different conductive materials. For example, the wirings M1_R1, M1_R2, and M1_I of the first metal layer M1 and the wiring M2_UL of the second metal layer M2 may include at least one metal material selected from aluminum, copper, tungsten, molybdenum, ruthenium, and cobalt. Metal layers (e.g., M3, M4, M5 . . . ) stacked on the fourth interlayer insulating layer 140 may be additionally disposed. Each of the stacked metal layers may include wirings for routing between cells.

Figure 6:
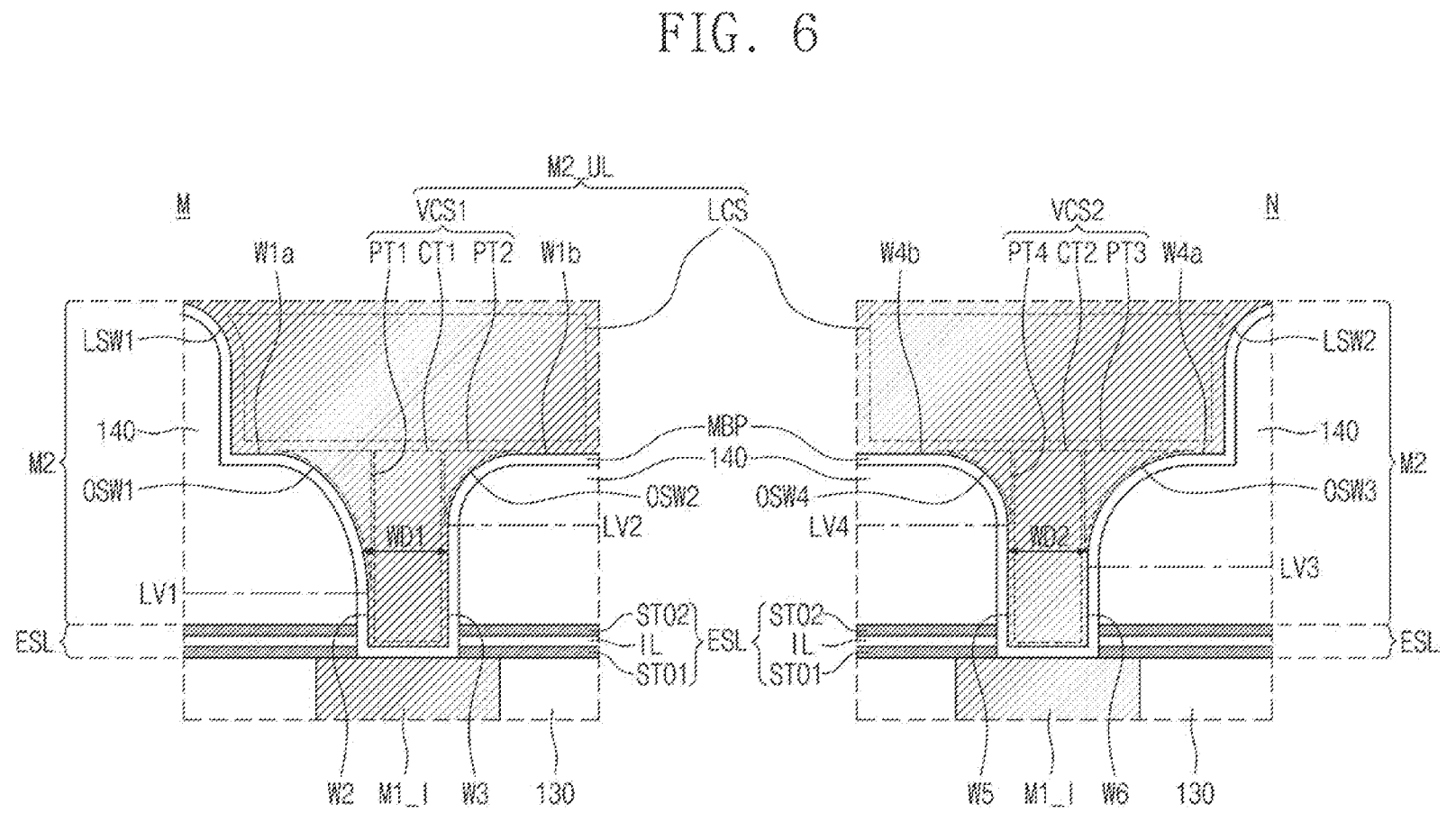

FIG. 6 is an enlarged view illustrating region "M" and region "N" of FIG. 5C. Referring to FIG. 6, the upper wiring M2_UL will be described in more detail.

Referring to FIG. 6, a barrier layer MBP may be interposed between the upper wirings M2_UL and the fourth interlayer insulating layer 140. The barrier layer MBP may cover and surround sidewalls and bottom surface of the upper wiring M2_UL.

The upper wirings M2_UL may further include a line structure LCS and via structures VCS1 and VCS2 provided respectively below the line structure LCS. The wiring of the first metal layer M1 and the wiring of the second metal layer M2 may be electrically connected to each other through the via structures VCS1 and VCS2. For example, the first via structure VCS1 may connect the line structure LCS and the first wiring M1_1 in the third direction D3.

The line structure LCS may have a line shape extending in the first direction D1. The first via structure VCS1 may penetrate the etch stop layer ESL and may be in contact with an upper surface of the first wiring M1_1.

The first via structure VCS1 may include a first outer surface OSW1 in contact with the fourth interlayer insulating layer 140 and a second outer surface OSW2 in contact with the fourth interlayer insulating layer 140 and opposite to the first outer surface OSW1. The first outer surface OSW1 may be spaced apart from the second outer surface OSW2 in the first direction D1. Each of the first outer surface OSW1 and the second outer surface OSW2 may be a curved surface. The first and second outer surfaces OSW1 and OSW2 may be disposed on both upper sides of the first via structure VCS1.

In detail, the first outer surface OSW1 may be a curved surface disposed between an first upper surface W1*a* of the fourth interlayer insulating layer 140 in the first direction D1 and a second surface W2 in the third direction D3. The second outer surface OSW1 may be a curved surface disposed between a second upper surface W1*b* of the fourth interlayer insulating layer 140 and a third surface W3 in the third direction D3. The first upper surface W1*a* and the second upper surface W1*b* may be an upper surface of the fourth interlayer insulating layer 140 that has the same level as an upper surface of the first via structure VCS1 and extends in the horizontal direction. Each of the first upper surface W1*a* and the second upper surface W1*b* may be in contact with a lower surface of the line structure LCS. Each of the first upper surface W1*a* and the second upper surface W1*b* may face each other in the first direction D1. Each of the first upper surface W1*a* and the second upper surface W1*b* may be spaced apart from each other in the first direction D1 with the first via structure VCS1 therebetween.

A normal vector of the first outer surface OSW1 may have a slope of a different sign than a normal vector of the second outer surface OSW2. One of the normal vector of the first outer surface OSW1 and the normal vector of the second outer surface OSW2 may have a positive slope, and the other may have a negative slope. For example, the normal of the first outer surface OSW1 may have a positive slope, and the normal of the second outer surface OSW2 may have a negative slope.

A curvature of the first outer surface OSW1 and a curvature of the second outer surface OSW2 may be different from each other. For example, the curvature of the first outer surface OSW1 may be smaller than the curvature of the second outer surface OSW2. A radius of curvature of the first outer surface OSW1 may be larger than a radius of curvature of the second outer surface OSW2. Accordingly, the area of the first outer surface OSW1 may be larger than the area of the second outer surface OSW2.

The curvature of the first outer surface OSW1 and the curvature of the second outer surface OSW2 may be changed toward an upper portion of the first via structure. For example, the curvature of the first outer surface OSW1 may decrease in the third direction D3.

As the first and second outer surfaces OSW1 and OSW2 have different curvatures, the first via structure VCS1 may have an asymmetric profile. In a manufacturing process to be described later, a processes for forming each of the first and second outer surfaces OSW1 and OSW2 may be performed separately, and thus the outer surfaces OSW1 and OSW2 of the first via structure VCS1 may have different curvatures from each other.

The lowest portion of the first outer surface OSW1 may have a first level LV1. The lowest portion of the second outer surface OSW2 may have a second level LV2. The first level LV1 and the second level LV2 may be different from each other. Although not particularly limited, as the curvature of the outer surface OSW becomes greater, the level of the lowest portion of the outer surface OSW may be lower. For example, if the curvature of the first outer surface OSW1 is smaller than the curvature of the second outer surface OSW2, the first level LV1 may be lower than the second level LV2.

The first via structure VCS1 may include a first portion PT1 in contact with the fourth interlayer insulating layer 140 and the first outer surface OSW1, a second portion PT2 in contact with the fourth interlayer insulating layer 140 and the second outer surface OSW2, and a first central portion CT1 interposed between the first portion PT1 and the second portion PT2. The first portion PT1 and the second portion PT2 may be spaced apart from each other in the first direction D1 with the first central portion CT1 interposed therebetween. The first portion PT1 may be a portion having the first outer surface OSW1 as a side wall, and the second portion PT2 may be a portion having the second outer surface OSW2 as a side wall.

An upper surface of the first portion PT1, an upper surface of the second portion PT2, and an upper surface of the first central portion CT1 may be positioned at the same level. The first central portion CT1 may have a constant width. A width of the first central portion CT1 may be equal to the minimum width of the first via structure VCS1. In each of the first and second portions PT1 and PT2, a width of the first via structure VCS1 may increase in the third direction D3.

A level of the upper surface of the first portion PT1 may be the same as the highest level of the first outer surface OSW1, and a level of a lower surface of the first portion PT1 may be the same as a first level LV1. A level of the upper surface of the second portion PT2 may be the same as the highest level of the second outer surface OSW2, and a level of a lower surface of the second portion PT2 may be the same as a second level LV2. The first level LV1 may be equal to or higher than the level of the lower surface of the first central portion CT1.

The first via structure VCS1 may include a first width WD1 in the first direction D1. The first width WD1 may decrease from the upper surface to the lower surface of the first via structure VCS1. A first width WD1 may decrease the upper surface to the lower surface of the first via structure VCS1 and then become constant. In another embodiment, the first width WD1 may decrease and then increase the upper surface to the lower surface of the first via structure VCS1.

A plurality of via structures VCS1 and VCS2 may be connected to one line structure LCS. The upper wiring M2_UL may include a second via structure VCS2 connected to the line structure LCS and adjacent to the first via structure VCS1. The second via structure VCS2 may penetrate the etch stop layer ESL and may be in contact with the upper surface of the first wiring M1_1.

The second via structure VCS2 may include a third outer surface OSW3 in contact with the fourth interlayer insulating layer 140 and a fourth outer surface OSW4 in contact with the fourth interlayer insulating layer 140 and opposite to the third outer surface OSW3. The third outer surface OSW3 and the fourth outer surface OSW4 may be spaced apart in the first direction D1. The third outer surface OSW3 and the fourth outer surface OSW4 may be curved surfaces. The third and fourth outer surfaces OSW3 and OSW4 may be disposed both upper sides of the second via structure VCS2.

In detail, the third outer surface OSW3 may be a curved surface disposed between a third upper surface W4*a* of the fourth interlayer insulating layer 140 in the first direction and a fifth surface W5 in the third direction D3. The fourth outer surface OSW4 may be a curved surface disposed between a fourth upper surface W4*b* of the fourth interlayer insulating layer 140 and a sixth surface W6 in the third direction D3. The third upper surface W4*a* and the fourth upper surface W4*b* may be an upper surface of the fourth interlayer insulating layer 140 that has the same level as the upper surface of the second via structure VCS2 and extends in the horizontal direction. The third upper surface W4*a* and the fourth upper surface W4*b* may each may be in contact with the lower surface of the line structure LCS. Each of the third upper surface W4*a* and the fourth upper surface W4*b* may face each other in the first direction D1. Each of the third upper surface W4*a* and the fourth upper surface W4*b* may be spaced apart from each other in the first direction D1 with the first via structure VCS1 interposed therebetween.

The normal of the first outer surface OSW1 and a normal of the fourth outer surface OSW4 have a slope of the same sign, and the normal of the second outer surface OSW2 and a normal of the third outer surface OSW3 may have a slope of the same sign. For example, the normal vector of the first outer surface OSW1 and the normal vector of the fourth outer surface OSW4 may have a positive slope, and the normal vector of the second outer surface OSW2 and the normal vectors of the third outer surface OSW3 may have a negative slope.

A curvature of the third outer surface OSW3 and a curvature of the fourth outer surface OSW4 may be different from each other. For example, the curvature of the third outer surface OSW3 may be smaller than the curvature of the fourth outer surface OSW4. A radius of curvature of the third outer surface OSW3 may be larger than a radius of curvature of the fourth outer surface OSW4. Accordingly, the area of the third outer surface OSW3 may be larger than the area of the fourth outer surface OSW4.

The curvature of the third outer surface OSW3 and the curvature of the fourth outer surface OSW4 may be changed toward the upper portion of the first via structure. For example, the curvature of the third outer surface OSW3 may decrease in the third direction D3.

As the third and fourth outer surfaces OSW3 and OSW4 have different curvatures, the second via structure VCS2 may have an asymmetric profile. The reason that the outer surfaces OSW3 and OSW4 of the second via structure VCS2 have different curvatures is that a processes for forming each of the third and fourth outer surfaces OSW3 and OSW4 in a manufacturing process to be described later are performed separately.

The curvature of the first outer surface OSW1 may be smaller than the curvature of the third outer surface OSW3. The curvature of the fourth outer surface OSW4 may be greater than the curvature of the second outer surface OSW2. That is, the smaller curvature between the curvature of the first outer surface OSW1 and the curvature of the second outer surface OSW2 may be smaller than the smaller curvature between the curvature of the third outer surface OSW3 and the curvature of the fourth outer surface OSW4. The greater curvature of the curvature of the first outer surface OSW1 and the curvature of the second outer surface OSW2 may be smaller than the greater curvature between the curvature of the third outer surface OSW3 and the curvature of the fourth outer surface OSW4. This is because, in the manufacturing method to be described later, an outer surface of the first via structure VCS1 is etched more than an outer surface of the second via structure VCS2.

The lowest portion of the third outer surface OSW3 may have a third level LV3. The lowest portion of the fourth outer surface OSW4 may have a fourth level LV4. The third level LV3 and fourth level LV4 may be different from each other. Although not particularly limited, as the curvature of the outer surface OSW becomes greater, the level of the lowest portion of the outer surface OSW may be lower. For example, if the curvature of the third outer surface OSW3 is smaller than the curvature of the fourth outer surface OSW4, the third level LV3 may be lower than the fourth level LV4.

The second via structure VCS2 may include a third portion PT3 in contact with the fourth interlayer insulating layer 140 and the third outer surface OSW3, a fourth portion PT4 in contact with the fourth interlayer insulating layer 140 and the fourth outer surface OSW4, and a second central portion CT2 interposed between the third portion PT3 and the fourth portion PT4. The third portion PT3 and the fourth portion PT4 may be spaced apart from each other in the first direction D1 with the second central portion CT2 interposed therebetween.

The third portion PT3 may correspond to the first portion PT1 described above, and the fourth portion PT4 may correspond to the second portion PT2 described above. The third portion PT3 may have the third outer surface OSW3 as a sidewall, and the fourth portion PT4 may have the third outer surface OSW4 as a sidewall.

An upper surface of the third portion PT3, an upper surface of the fourth portion PT4, and an upper surface of the second central portion CT2 may be disposed at the same level. The second central portion CT2 may have a constant width. A width of the second central portion CT2 may be equal to the minimum width of the second via structure VCS2. In each of the third and fourth portions PT3 and PT4, a width of the second via structure VCS2 may increase in the third direction D3.

A level of the upper surface of the third portion PT3 may be the same as the highest level of the third outer surface OSW3, and a level of a lower surface of the third portion PT3 may be the same as a third level LV3. A level of the upper surface of the fourth portion PT4 may be the same as the highest level of the second outer surface OSW2, and a level of a lower surface of the fourth portion PT4 may be the same as a fourth level LV4. The third level LV3 may be equal to or higher than a level of a lower surface of the second central portion CT2.

The first level LV1 may be different from the third level LV3. For example, the lower level between the first level LV1 and the second level LV2 may be lower than the lower level between the third level LV3 and the fourth level LV4. The higher level between the first level LV1 and the second level LV2 may be lower than the higher level between the third level LV3 and the fourth level LV4. This is because, in the manufacturing method to be described later, the outer surface of the first via structure VCS1 is etched more than the outer surface of the second via structure VCS2.

The second via structure VCS2 may include a second width WD2 in the first direction D1. The second width WD2 may decrease from the upper surface to the lower surface of the second via structure VCS2. The second width WD2 may decrease from the upper surface to the lower surface of the second via structure VCS2 and then become constant. In another embodiment, the second width WD2 may decrease and then increase from the upper surface to the lower surface of the second via structure VCS2.

The line structure LCS may include a first line outer surface LSW1 that is in contact with the fourth interlayer insulating layer 140 and is curved, and a second line outer surface LSW2 that is in contact with the fourth interlayer insulating layer 140, is curved, and faces the first line outer surface LSW1.

A normal vector of the first line outer surface LSW1 and a normal vector of the second line outer surface LSW2 may have slopes of different signs. The first line outer surface LSW1 and the second line outer surface LSW2 may be spaced apart from each other in the first direction D1.

In detail, the first line outer surface LSW1 may be a curved surface disposed between the upper surface of the line structure LCS and a first side surface in the third direction D3. The second line outer surface LSW2 may be a curved surface disposed between the upper surface of the line structure LCS and a second side surface in the third direction D3. The first side surface and the second side surface may face each other in the first direction D1.

The first line outer surface LSW1 may be adjacent to the first outer surface OSW1 of the first via structure VCS1. The normal vector of the first outer surface LSW1 may have a slope of the same sign as the normal vector of the first outer surface OSW1. The second line outer surface LSW2 may be adjacent to the third outer surface OSW3 of the second via structure VCS2. The normal of the second line outer surface LSW2 may have a slope of the same sign as the normal of the third outer surface OSW2.

A curvature of the first line outer surface LSW1 and a curvature of the second line outer surface LSW2 may be different from each other. For example, the curvature of the first line outer surface LSW1 may be smaller than the curvature of the second line outer surface LSW2. The curvature of each of the first and second line outer surfaces LSW1 and LSW2 may decrease toward the upper portion of the line structure LCS.

The via structures VCS1 and VCS2 and the fourth interlayer insulating layer 140 according to the present embodiment illustrate a specific metal layer in a back-end-of-line (BEOL) layer. However, the via structures VCS1 and VCS2 and the fourth interlayer insulating layer 140 according to the present embodiment may be applied not only to a specific metal layer but also to at least one of other metal layers, for example, M1, M2, M3, M4, and M5.

According to embodiments of the disclosure, the outer surfaces of the via structures VCS1 and VCS2 may be curved, thereby increasing the width of the upper portions of the via structures VCS1 and VCS2. Accordingly, migration of electrons between the first wiring M1_1 and the upper wiring M2_UL may be smooth. In addition, as both outer surfaces of each of the via structures VCS1 and VCS2 have a round profile, formation of voids may be prevented in a process of filling a via hole with metal, which will be described later. Furthermore, both outer surfaces of each of the via structures VCS1 and VCS2 may be formed by an etching process with different incident angles to have different curvatures, thereby preventing the first wiring M1_1 from being denatured by the etching process.

FIGS. 7A to 12C are cross-sectional views for illustrating a method of manufacturing a semiconductor device according to embodiments of the disclosure. In detail, FIGS. 7A, 8A, 9A, 10A, 11A, and 12A are cross-sectional views corresponding to line A-A' in FIG. 4. FIG. 10B is a cross-sectional view corresponding to line B-B' in FIG. 4. FIGS. 9B, 10C, 11B, and 12B are cross-sectional views corresponding to line C-C' in FIG. 4. FIGS. 7B, 8B, 9C, 10D, 11C, and 12C are cross-sectional views corresponding to line D-D' in FIG. 4.

Figure 7A:
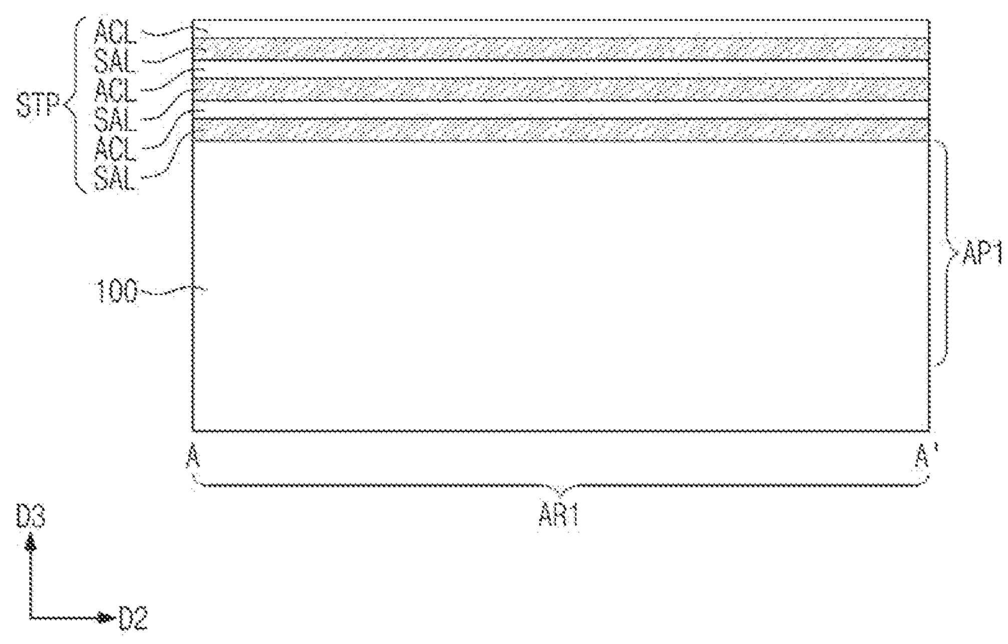
FIGS. 7A, 7B, 8A, 8B, 9A, 9B, 9C, 10A, 10B, 10C, 10D, 11A, 11B, 11C, 12A, 12B and 12C are cross-sectional views for illustrating a method of manufacturing a semiconductor device according to one or more embodiments of the disclosure.
Figure 7B:
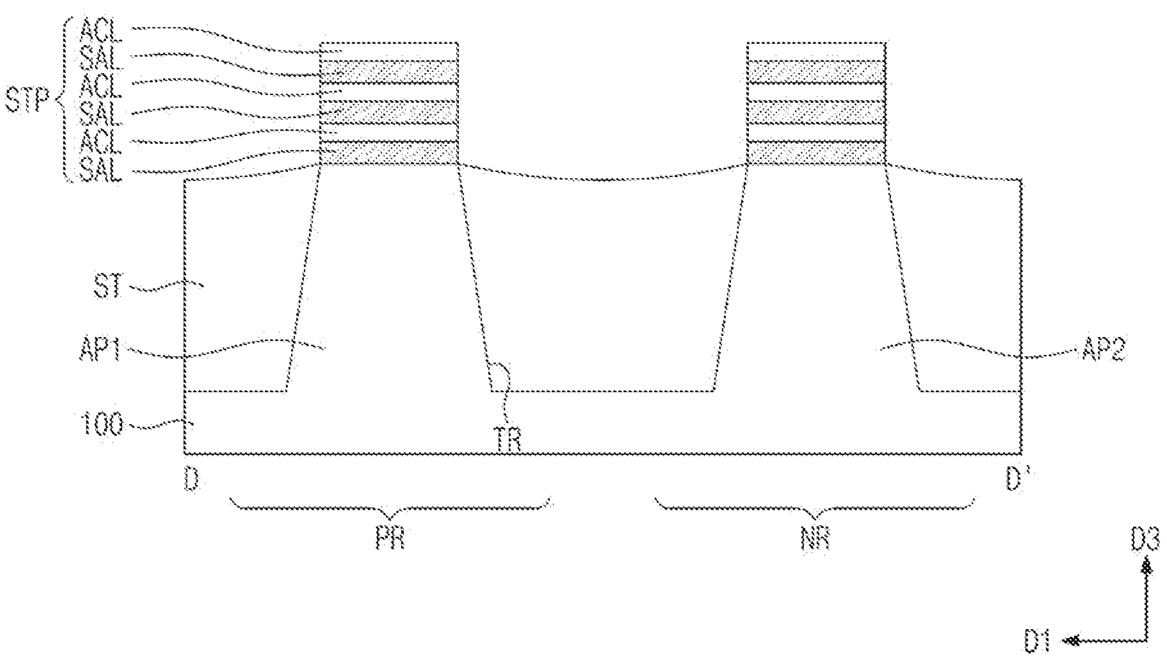

Referring to FIGS. 7A and 7B, a substrate 100 including a PMOSFET region PR and a NMOSFET region NR may be provided. Active layers ACL and sacrificial layers SAL may be formed on the substrate 100 to be alternately stacked. The active layers ACL may include one of silicon (Si), germanium (Ge), and silicon-germanium (SiGe), and the sacrificial layers SAL may include another one of silicon (Si), germanium (Ge), and silicon-germanium (SiGe).

The sacrificial layer SAL may include a material that may have an etch selectivity with respect to the active layer ACL. For example, the active layers ACL may include silicon (Si), and the sacrificial layers SAL may include silicon-germanium (SiGe). A concentration of germanium (Ge) in each of the sacrificial layers SAL may be 10 at % to 30 at %.

Mask patterns may be formed on the PMOSFET region PR and NMOSFET region NR of the substrate 100, respectively. The mask pattern may have a line shape or a bar shape extending in a second direction D2.

A patterning process may be performed using the mask patterns as an etch mask, to form a trench TR defining a first active pattern AP1 and a second active pattern AP2. The first active pattern AP1 may be formed on the PMOSFET region PR. The second active pattern AP2 may be formed on the NMOSFET region NR.

A stacked pattern STP may be formed on each of the first and second active patterns AP1 and AP2. The stacked pattern STP may include the active layers ACL and the sacrificial layers SAL alternately stacked with each other. The stacked pattern STP may be formed together with the first and second active patterns AP1 and AP2 during the patterning process.

A device isolation layer ST may be formed to fill the trench TR. In detail, an insulating layer may be formed on the entire surface of the substrate 100 to cover the first and second active patterns AP1 and AP2 and the stacked patterns STP. The insulating layer may be recessed until the stacked patterns STP are exposed to form the device isolation layer ST.

The device isolation layer ST may include an insulating material such as a silicon oxide layer. The stacked patterns STP may be exposed on the device isolation layer ST. That is, the stacked patterns STP may protrude vertically above the device isolation layer ST.

Figure 8A:
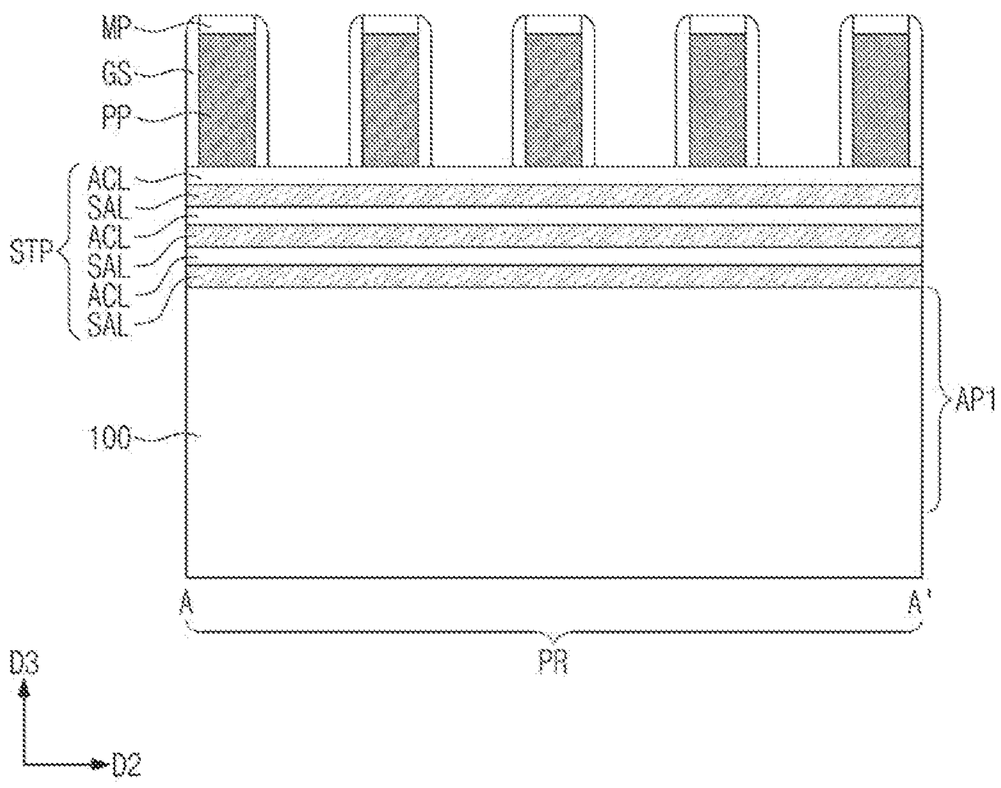
Figure 8B:
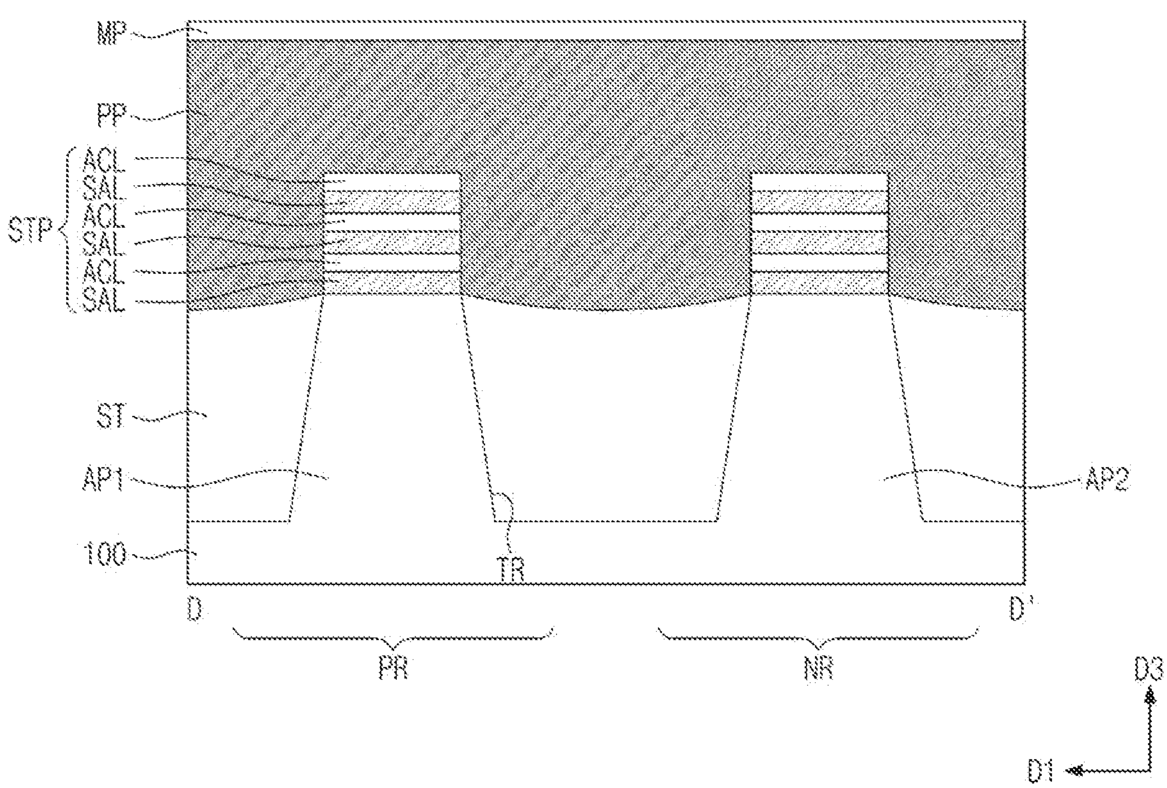

Referring to FIGS. 8A and 8B, sacrificial patterns PP may be formed across the stacked patterns STP on the substrate 100. Each of the sacrificial patterns PP may be formed in a line shape or a bar shape extending in a first direction D1. The sacrificial patterns PP may be arranged in the second direction D2 with a first pitch.

In detail, forming the sacrificial patterns PP may include forming a sacrificial layer on the front surface of the substrate 100, forming hard mask patterns MP on the sacrificial layer, and patterning the sacrificial layer using an etch mask MP as an etch mask. The sacrificial layer may include polysilicon.

A pair of gate spacers GS may be formed on both sidewalls of each of the sacrificial patterns PP. Forming the gate spacers GS may include conformally forming a gate spacer layer on the front surface of the substrate 100 and anisotropically etching the gate spacer layer. In one or more embodiments of the disclosure, the gate spacer GS may be a multi-layer including at least two layers.

Figure 9A:
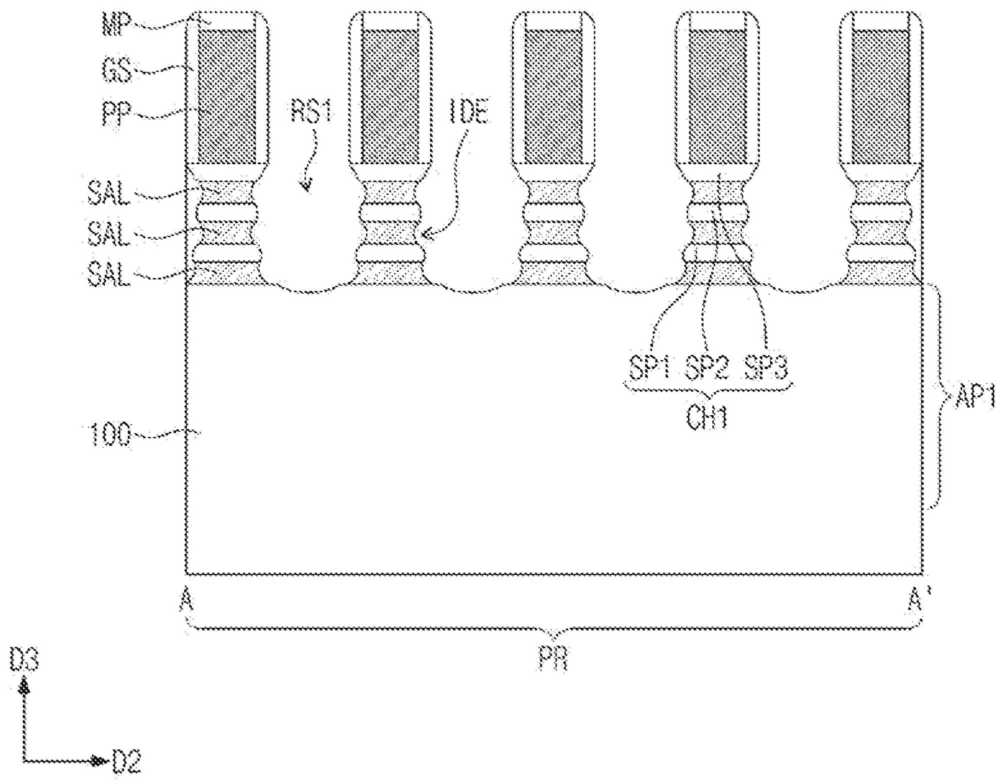
Figure 9B:
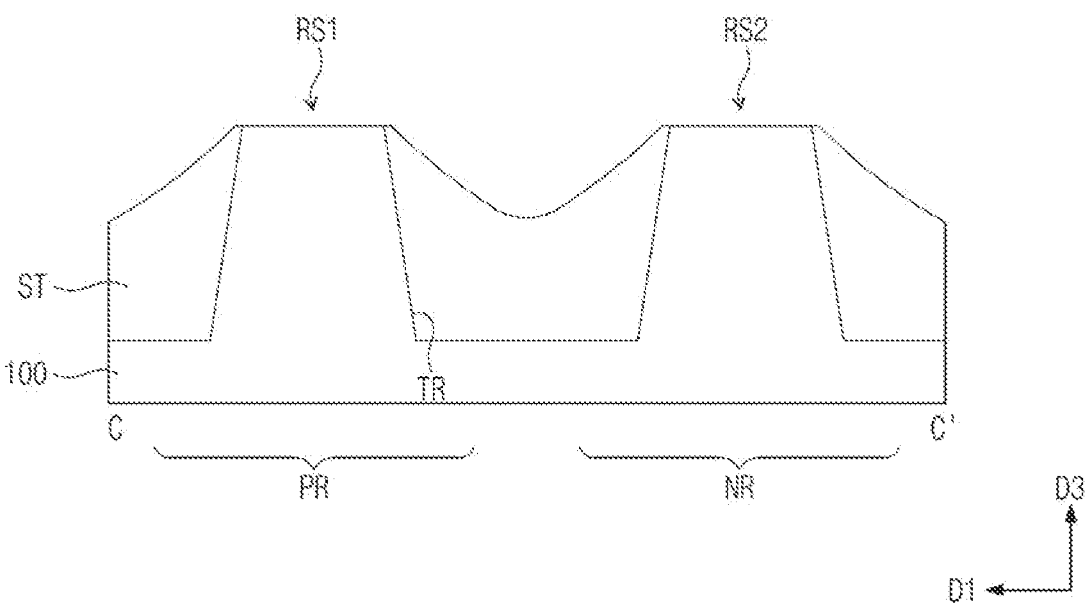
Figure 9C:
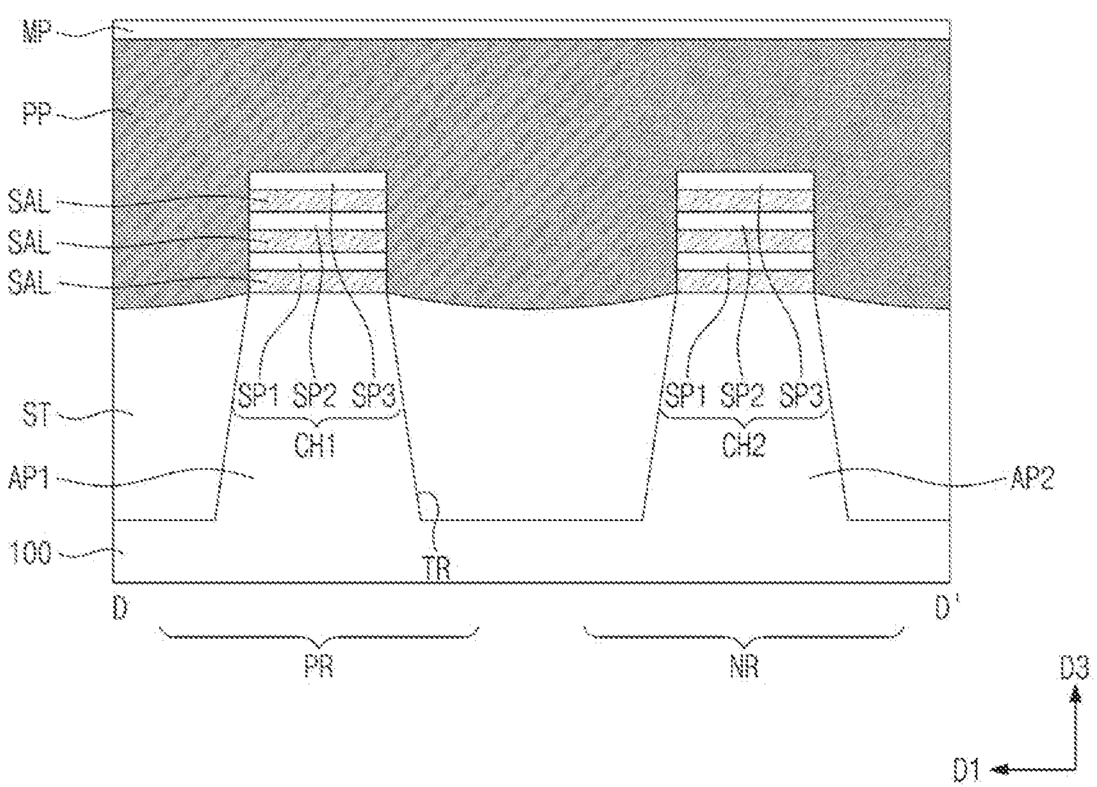
Figure 10A:
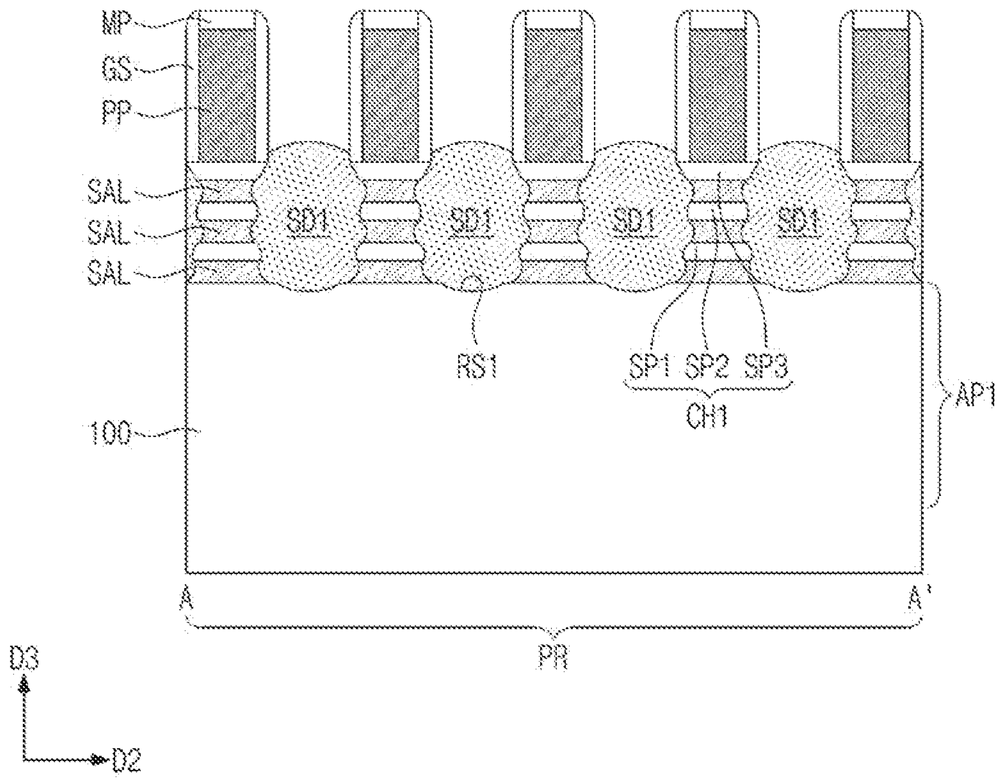
Figure 10B:
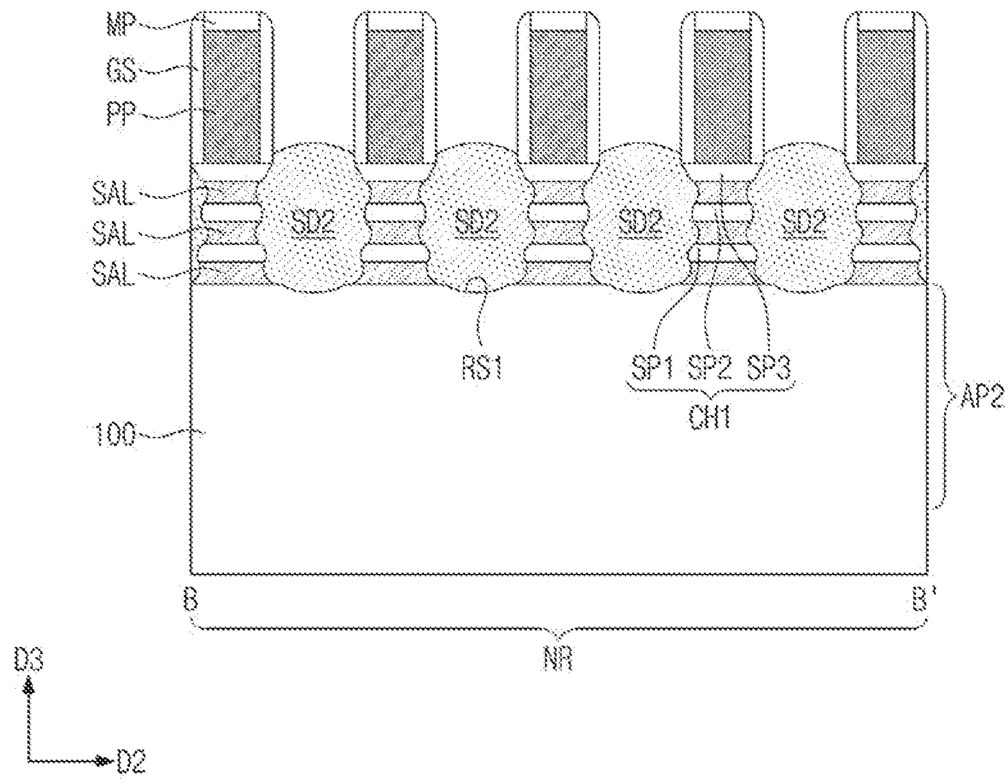
Figure 10C:
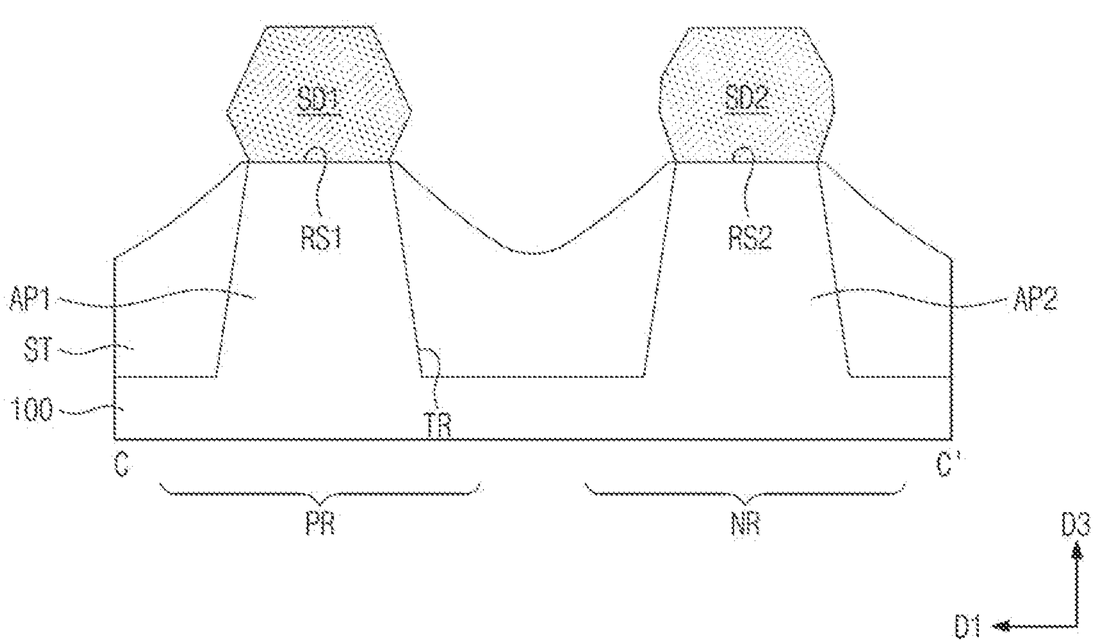
Figure 10D:
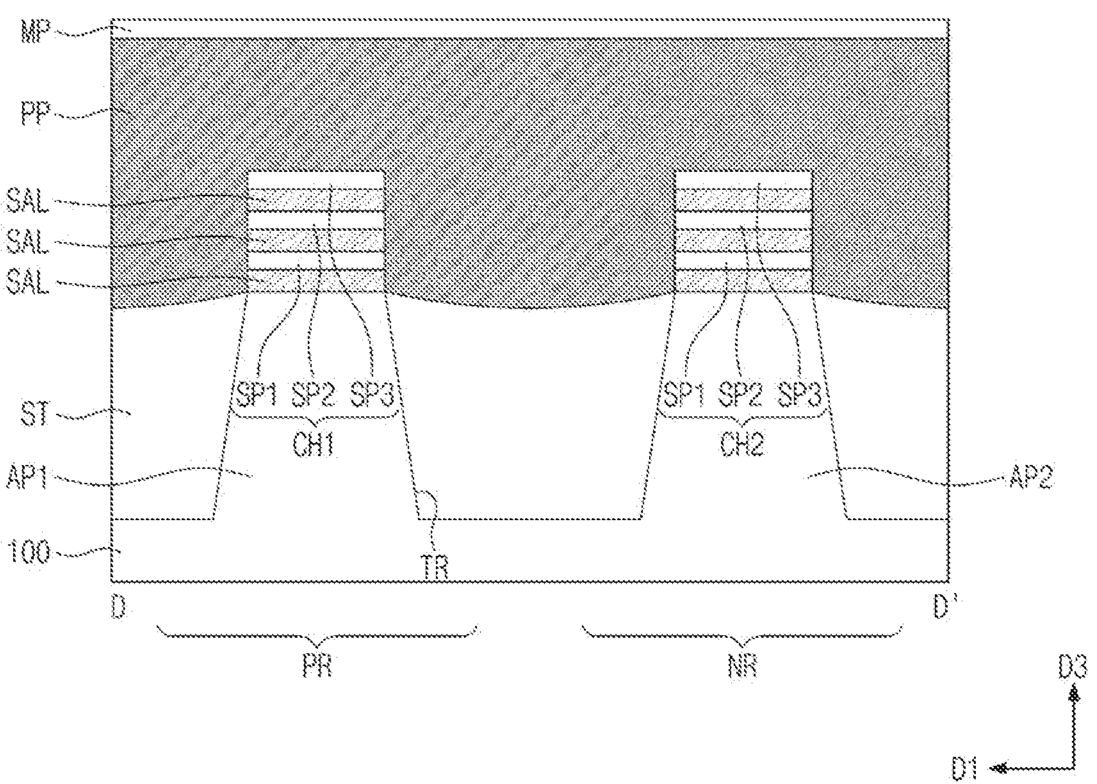

Referring to FIGS. 9A to 9C, first recesses RS1 may be formed in the stacked pattern STP on the first active pattern AP1. Second recesses RS2 may be formed in the stacked pattern STP on the second active pattern AP2. While forming the first and second recesses RS1 and RS2, the device isolation layer ST on both sides of the first and second active patterns AP1 and AP2 may be further recessed (refer to FIG. 9B).

In detail, the first recesses RS1 may be formed by etching the stacked pattern STP on the first active pattern AP1 using the hard mask patterns MA and the gate spacers GS as an etch mask. The first recess RS1 may be formed between a pair of sacrificial patterns PP. Forming the first recess RS1 may include additionally performing a selective etching process on the exposed sacrificial layers SAL. Each of the sacrificial layers SAL may be indented through the selective etching process to form an indented region IDE. Accordingly, the first recess RS1 may have a wavy inner wall. The second recesses RS2 in the stacked pattern STP on the second active pattern AP2 may be formed in the same manner as the first recesses RS1.

First to third semiconductor patterns SP1, SP2, and SP3 sequentially stacked may be formed from the active layers ACL, respectively, between adjacent first recesses RS1. The first to third semiconductor patterns SP1, SP2, and SP3 between adjacent first recesses RS1 may form a first channel pattern CH1. The first to third semiconductor patterns SP1, SP2, and SP3 between adjacent second recesses RS2 may form a second channel pattern CH2.

Referring to FIGS. 10A to 10D, first source/drain patterns SD1 may be formed in the first recesses RS1, respectively. In detail, an SEG process using an inner wall of the first recess RS1 as a seed layer may be performed to form an epitaxial layer that fills the first recess RS1. The epitaxial layer may be grown using the first to third semiconductor patterns SP1, SP2, and SP3 exposed by the first recess RS1 and the substrate 100 as seeds. As an example, the SEG process may include a chemical vapor deposition (CVD) process or a molecular beam epitaxy (MBE) process.

In one or more embodiments of the disclosure, the first source/drain pattern SD1 may include a semiconductor element (e.g., SiGe) having a lattice constant greater than a lattice constant of the semiconductor element of the substrate 100. While the first source/drain pattern SD1 is formed, impurities (e.g., boron, gallium, or indium) that cause the first source/drain pattern SD1 to have a p-type may be injected in-situ. As another example, after the first source/drain pattern SD1 is formed, impurities may be injected into the first source/drain pattern SD1.

Second source/drain patterns SD2 may be formed in the second recesses RS2, respectively. In detail, the second source/drain pattern SD2 may be formed by performing a SEG process using an inner wall of the second recess RS2 as a seed layer.

In one or more embodiments of the disclosure, the second source/drain pattern SD2 may include the same semiconductor element (e.g., Si) as the substrate 100. While the second source/drain pattern SD2 is formed, impurities (e.g., phosphorus, arsenic, or antimony) that cause the second source/drain pattern SD2 to be n-type may be injected in-situ. As another example, after the second source/drain pattern SD2 is formed, impurities may be injected into the second source/drain pattern SD2.

Figure 11A:
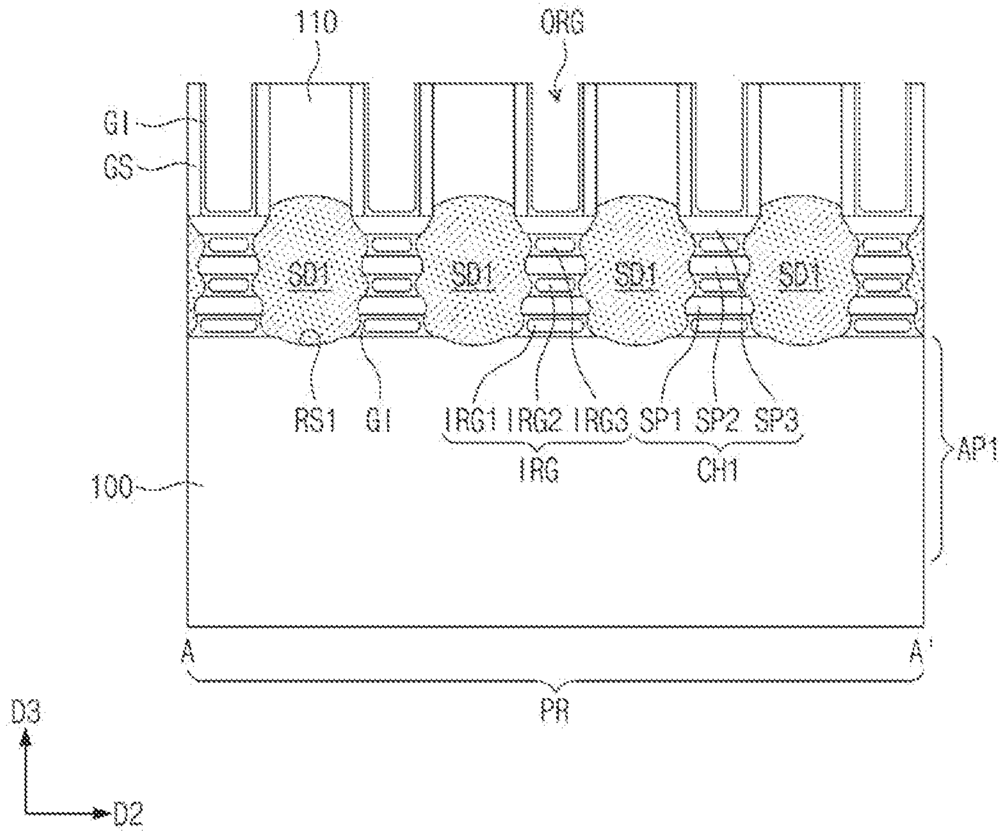
Figure 11B:
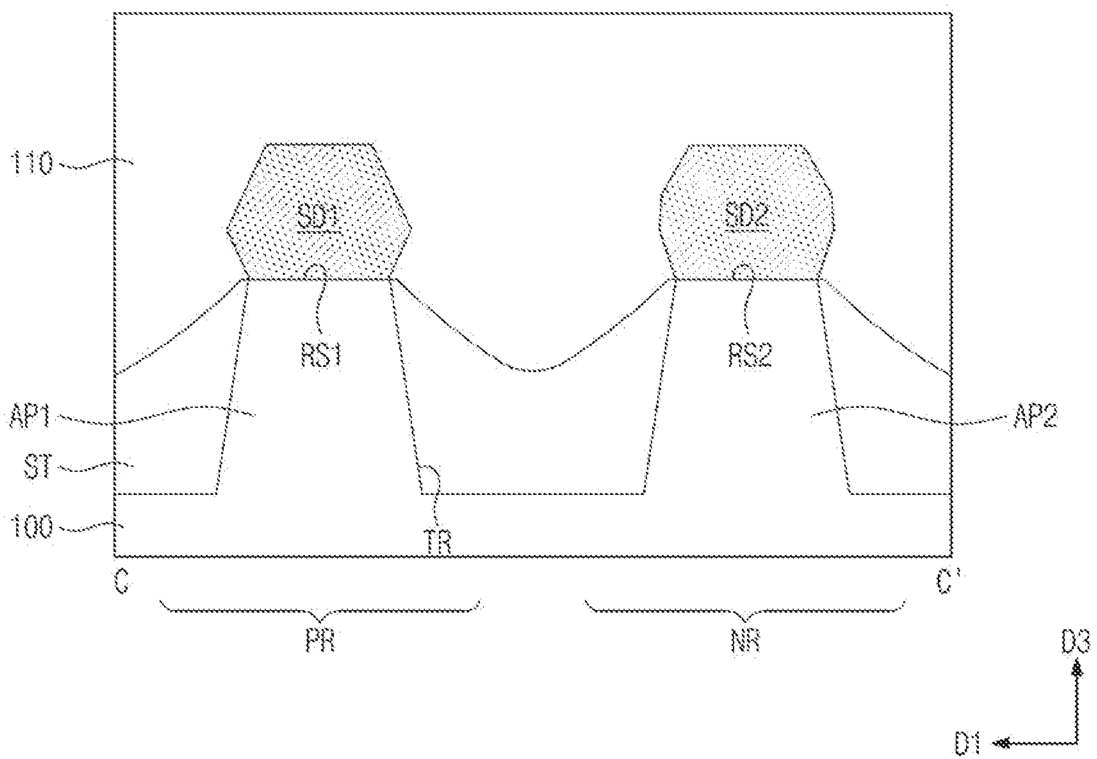
Figure 11C:
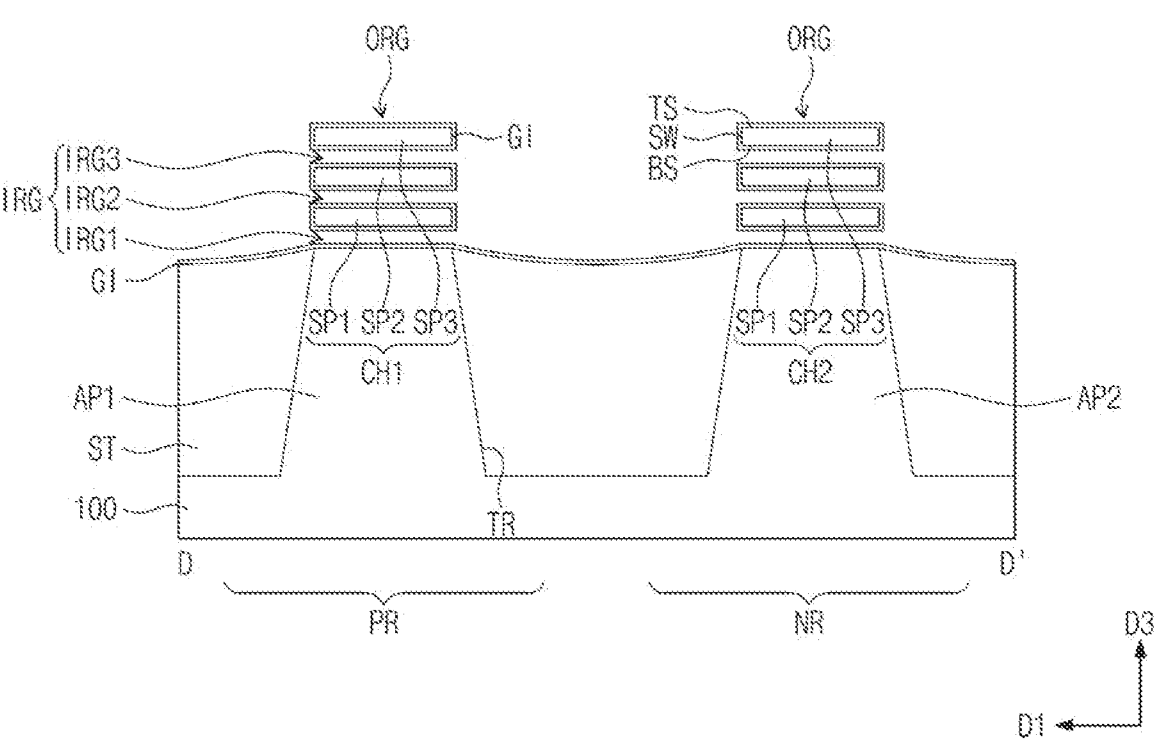

Referring to FIGS. 11A to 11C, a first interlayer insulating layer 110 covering the first and second source/drain patterns SD1 and SD2, hard mask patterns MP, and gate spacers GS may be formed. As an example, the first interlayer insulating layer 110 may include a silicon oxide layer.

The first interlayer insulating layer 110 may be planarized until upper surfaces of the sacrificial patterns PP are exposed. Planarization of the first interlayer insulating layer 110 may be performed using an etch back or chemical mechanical polishing (CMP) process. During the planarization process, all hard mask patterns MP may be removed. As a result, the upper surface of the first interlayer insulating layer 110 may be coplanar with upper surfaces of the sacrificial patterns PP and the gate spacers GS.

Exposed sacrificial patterns PP may be selectively removed. By removing the sacrificial patterns PP, an outer region ORG exposing the first and second channel patterns CH1 and CH2 may be formed (refer to FIG. 11C). Removing the sacrificial patterns PP may include wet etching using an etchant that selectively etches polysilicon.

The sacrificial layers SAL exposed through the outer region ORG may be selectively removed to form inner regions IRG (refer to FIG. 11C). In detail, by performing an etching process to selectively etch the sacrificial layers SAL, only the sacrificial layers SAL may be removed while leaving the first to third semiconductor patterns SP1, SP2, and SP3 intact. The etching process may have a high etch rate for silicon-germanium having a relatively high germanium concentration. For example, the etching process may have a high etch rate for silicon-germanium with a germanium concentration greater than 10 at %.

During the etching process, sacrificial layers SAL on the PMOSFET region PR and NMOSFET region NR may be removed. The etching process may be wet etching. The etchant used in the etching process may quickly remove the sacrificial layer SAL having a relatively high germanium concentration.

Referring again to FIG. 11C, the sacrificial layers SAL may be selectively removed, while leaving the first to third semiconductor patterns SP1, SP2, and SP3 stacked on each of the first and second active patterns AP1 and AP2. First to third inner regions IRG1, IRG2, and IRG3 may be formed through the regions from which the sacrificial layers SAL have been removed.

In detail, a first inner region IRG1 may be formed between the active pattern AP1 or AP2 and the first semiconductor pattern SP1, and a second inner region IRG1 may be formed between the first semiconductor pattern SP1 and the second semiconductor pattern SP2, and a third inner region IRG3 may be formed between the second semiconductor pattern SP2 and the third semiconductor pattern SP3.

Referring again to FIGS. 11A to 11C, a gate insulating layer GI may be formed on the exposed first to third semiconductor patterns SP1, SP2, and SP3. The gate insulating layer GI may be formed to surround each of the first to third semiconductor patterns SP1, SP2, and SP3. The gate insulating layer GI may be formed in each of the first to third inner regions IRG1, IRG2, and IRG3. The gate insulating layer GI may be formed in the outer region ORG.

Figure 12A:
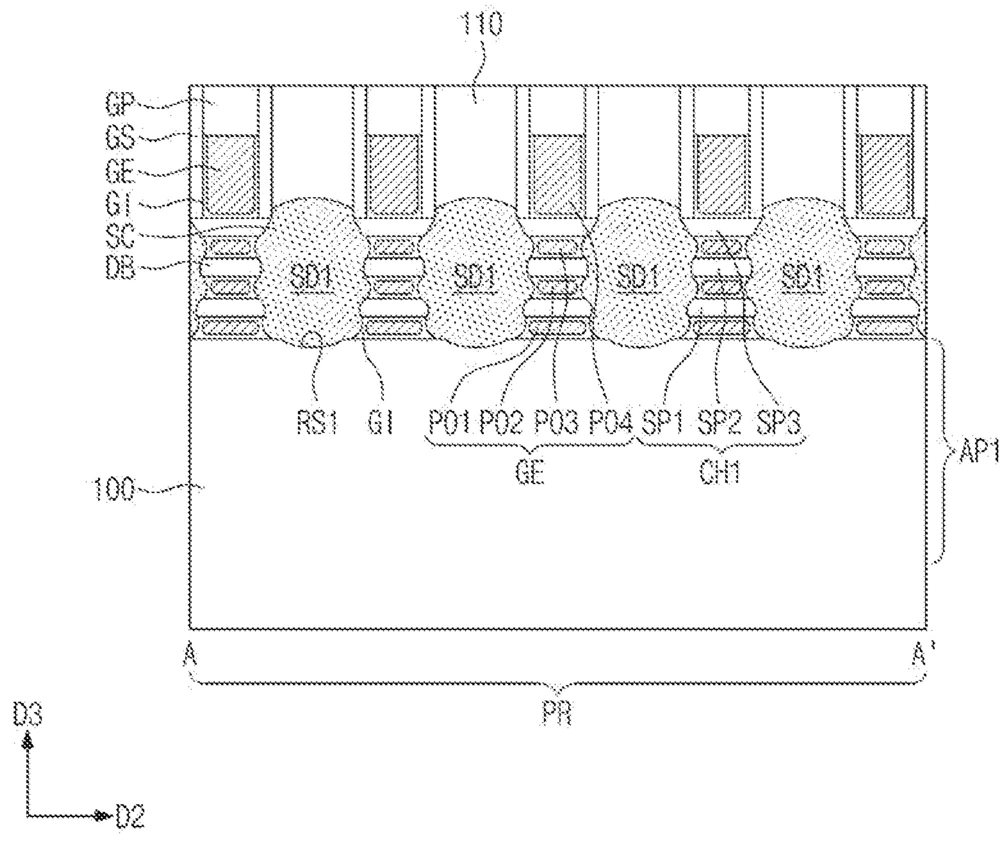
Figure 12B:
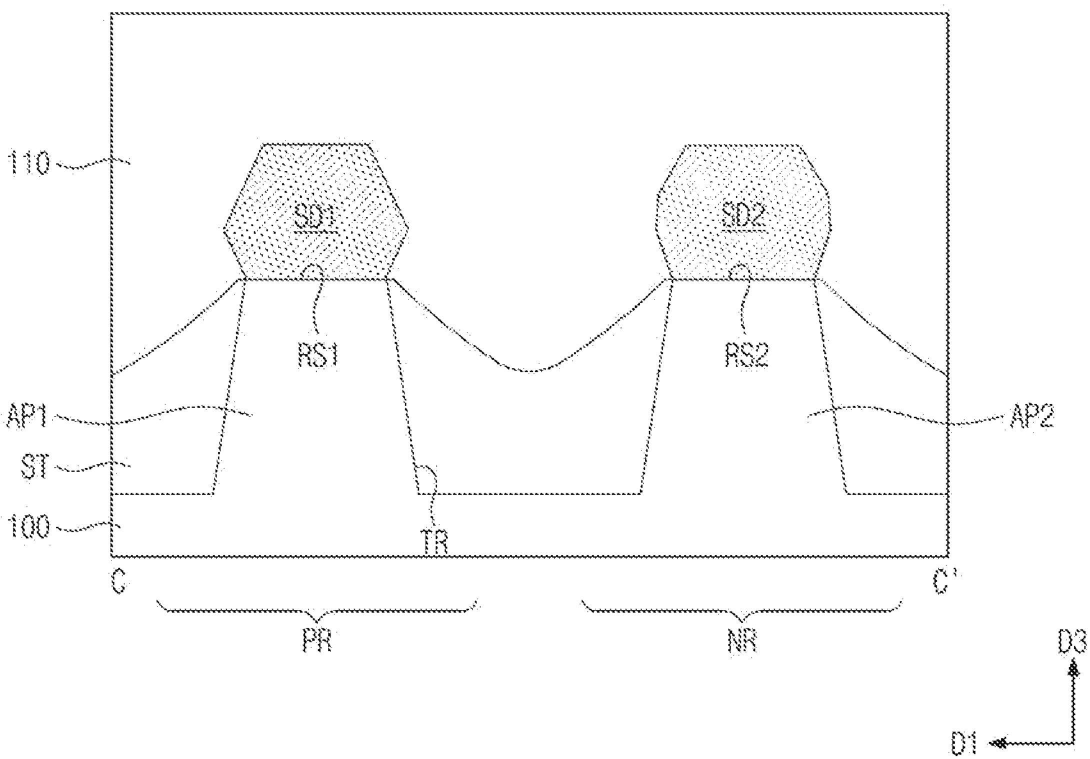
Figure 12C:
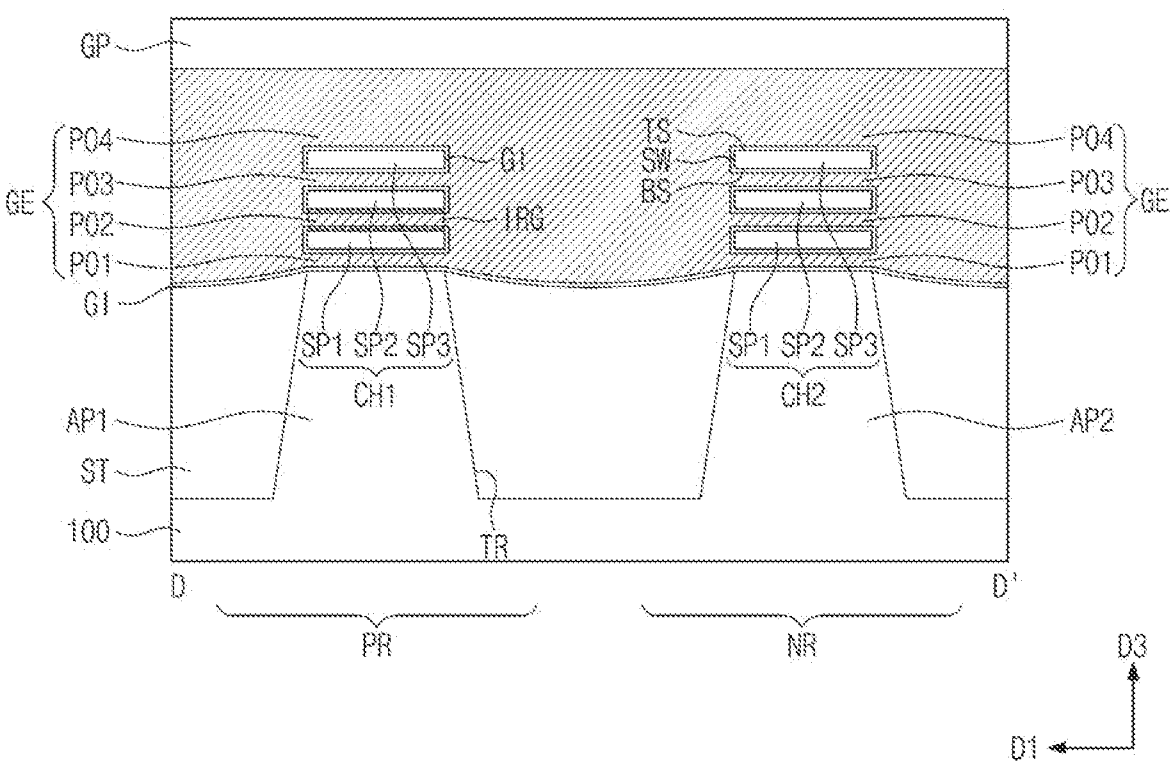

Referring to FIGS. 12A to 12C, a gate electrode GE may be formed on the gate insulating layer GI. The gate electrode GE may include first and second portions PO1 and PO2 formed in the first and second inner regions IRG1 and IRG2, respectively, and a third portion PO3 formed within the outer region ORG. The gate electrode GE may be recessed, reducing height thereof. A gate capping pattern GP may be formed on the recessed gate electrode GE. The gate electrode GE may not be formed on the dummy region DM.

Referring again to FIGS. 5A to 5D, a second interlayer insulating layer 120 may be formed on the first interlayer insulating layer 110. The second interlayer insulating layer 120 may include a silicon oxide layer. Active contacts AC may be formed through the second interlayer insulating layer 120 and the first interlayer insulating layer 110 to be electrically connected to the first and second source/drain patterns SD1 and SD2. A gate contact GC may be formed through the second interlayer insulating layer 120 and the gate capping pattern GP to be electrically connected to the gate electrode GE.

Forming each active contact AC and gate contact GC may include forming a barrier pattern BM and forming a conductive pattern FM on the barrier pattern BM. The barrier pattern BM may be formed conformally and may include a metal layer/metal nitride layer. The conductive pattern FM may include a low-resistance metal.

Separation structures DB may be formed at a first boundary BD1 and a second boundary BD2 of the single height cell SHC, respectively. The separation structure DB may extend from the second interlayer insulating layer 120 through the gate electrode GE into the active pattern AP1 or AP2. The separation structure DB may include an insulating material such as a silicon oxide layer or a silicon nitride layer.

A third interlayer insulating layer 130 may be formed on the active contacts AC and the gate contacts GC. A first metal layer M1 may be formed in the third interlayer insulating layer 130. A fourth interlayer insulating layer 140 may be formed on the third interlayer insulating layer 130. A second metal layer M2 may be formed in the fourth interlayer insulating layer 140.

Figure 15:
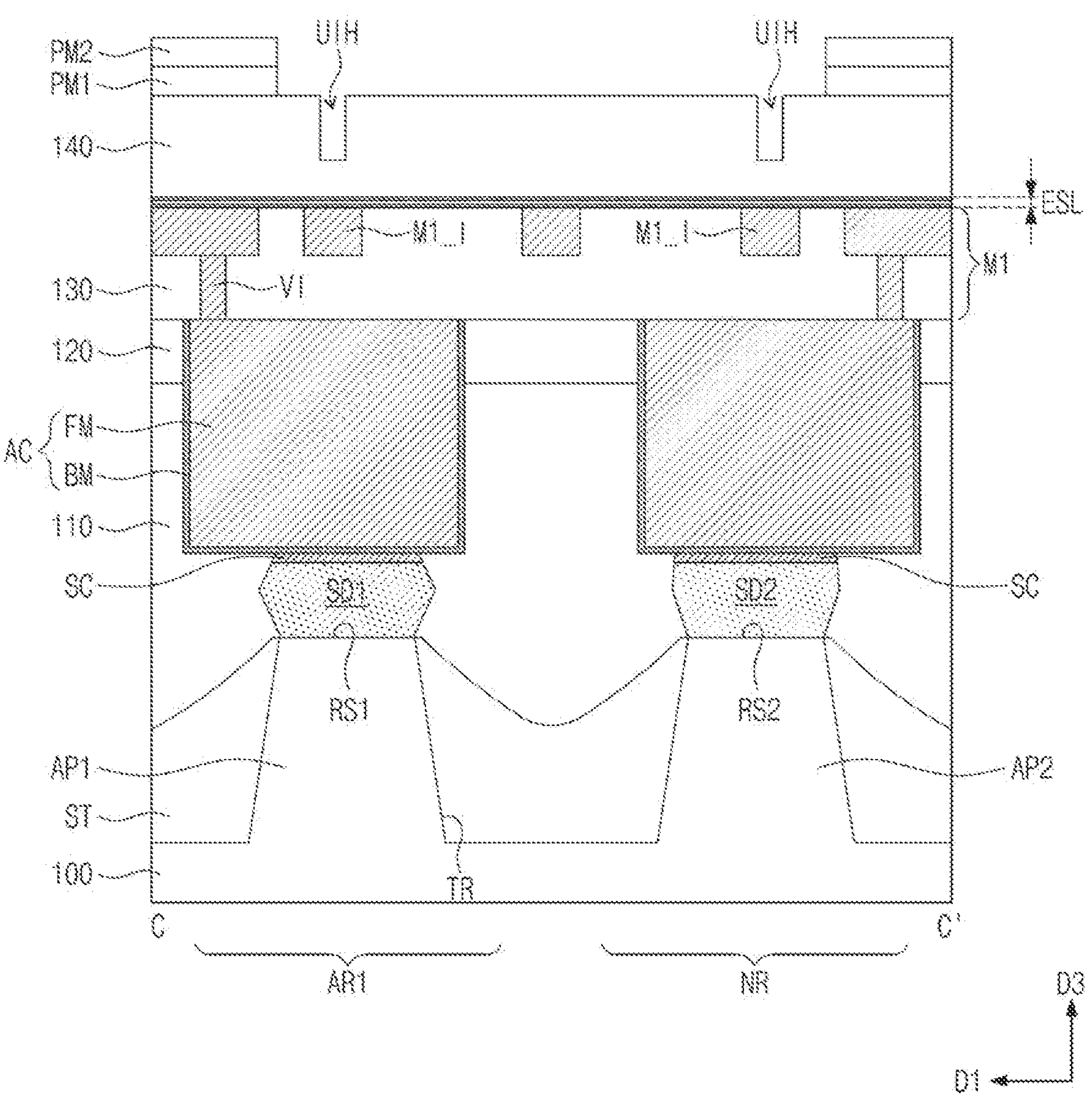
Figure 16:
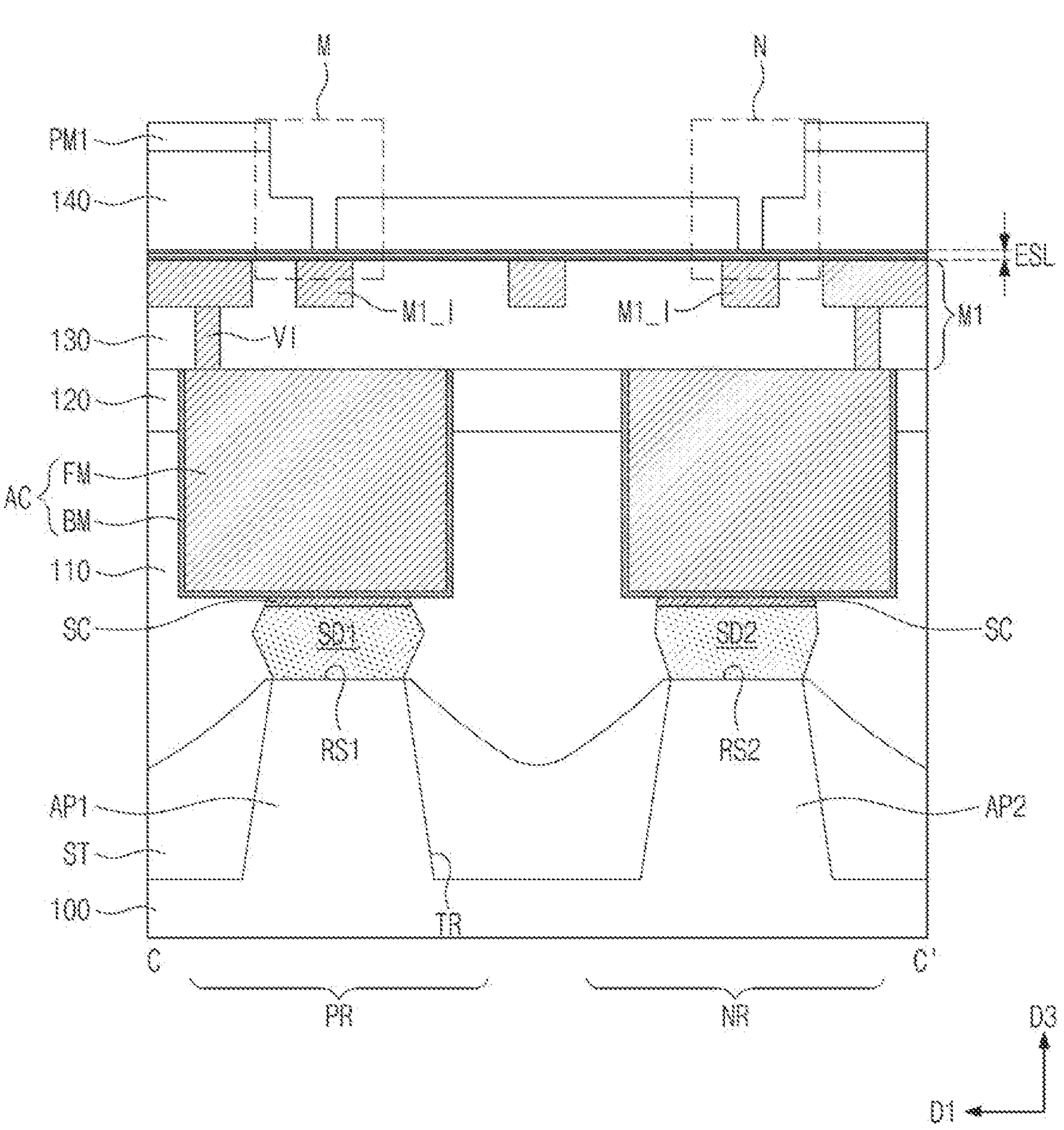
Figure 17:
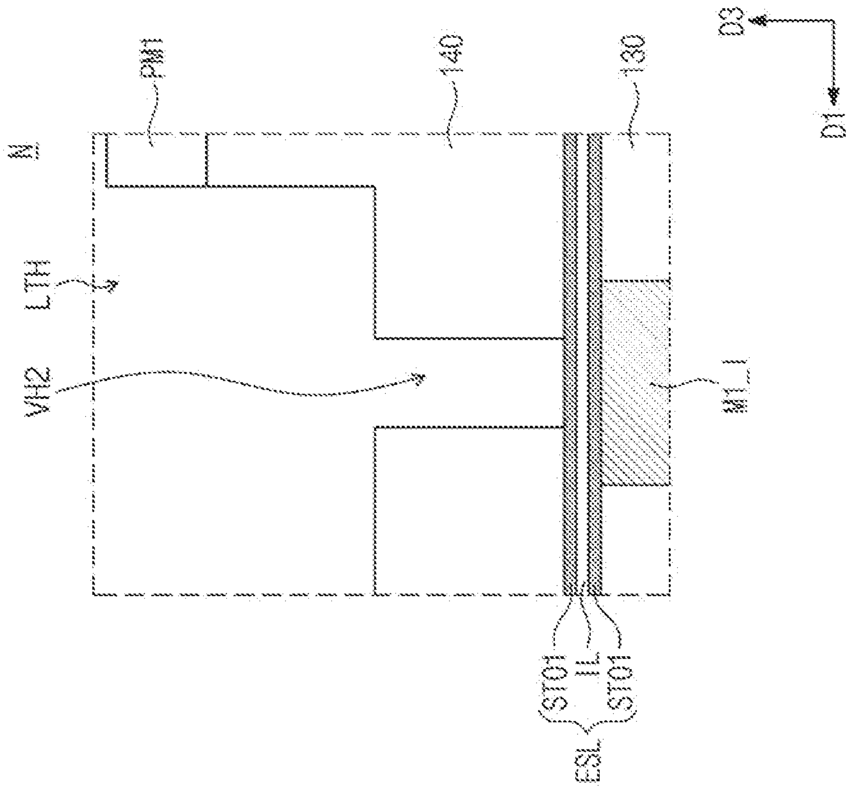
Figure 17:
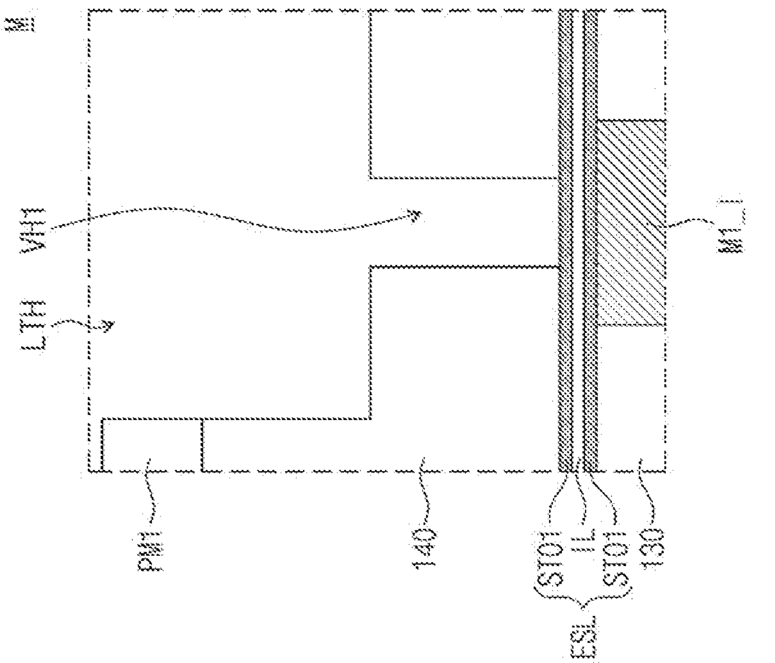
Figure 18:
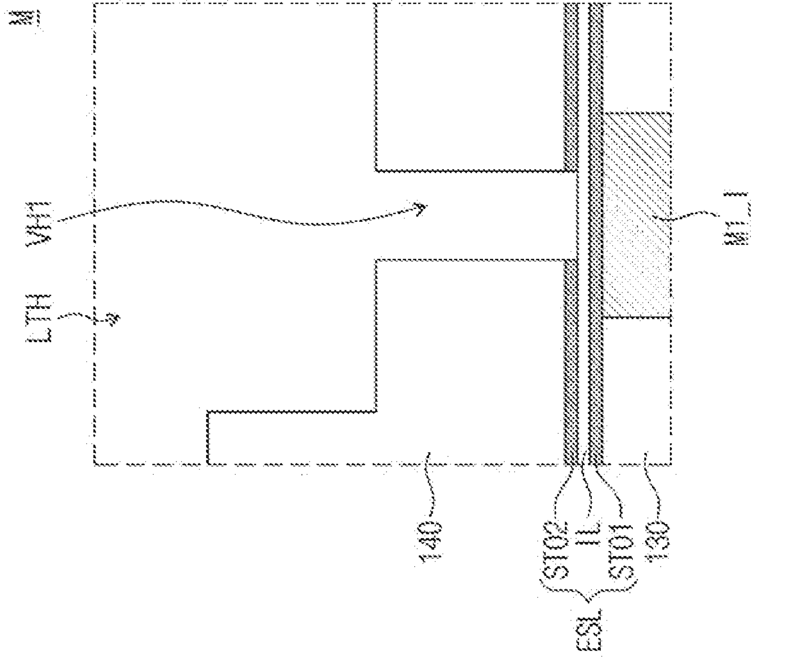
Figure 19:
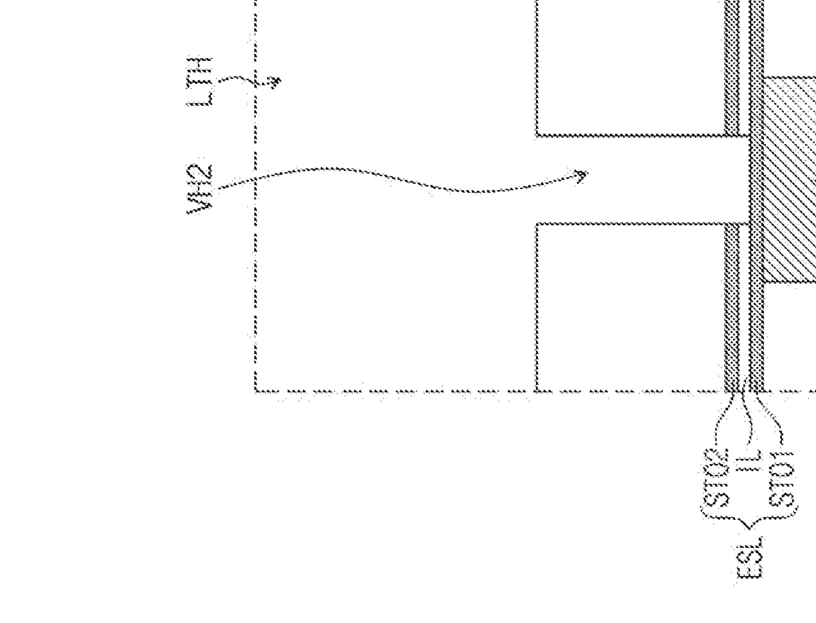
Figure 19:
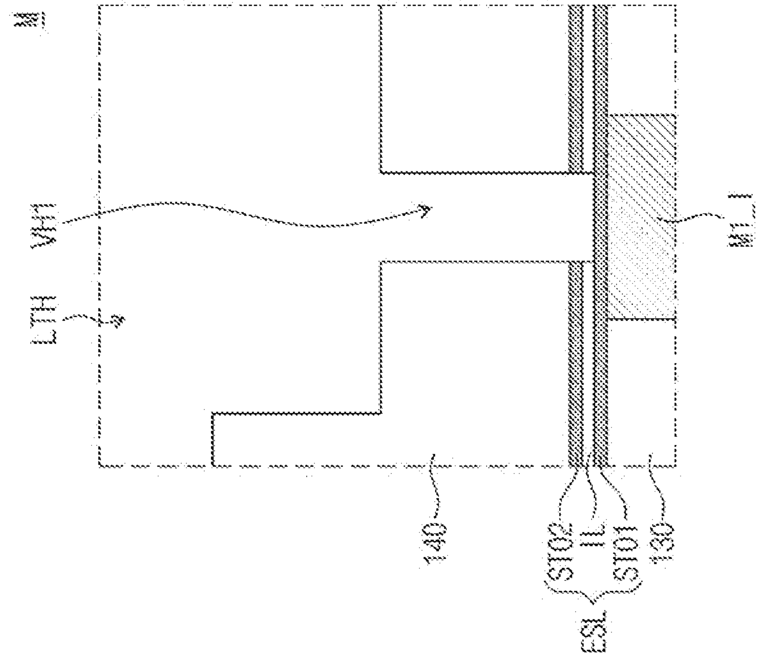
Figure 22:
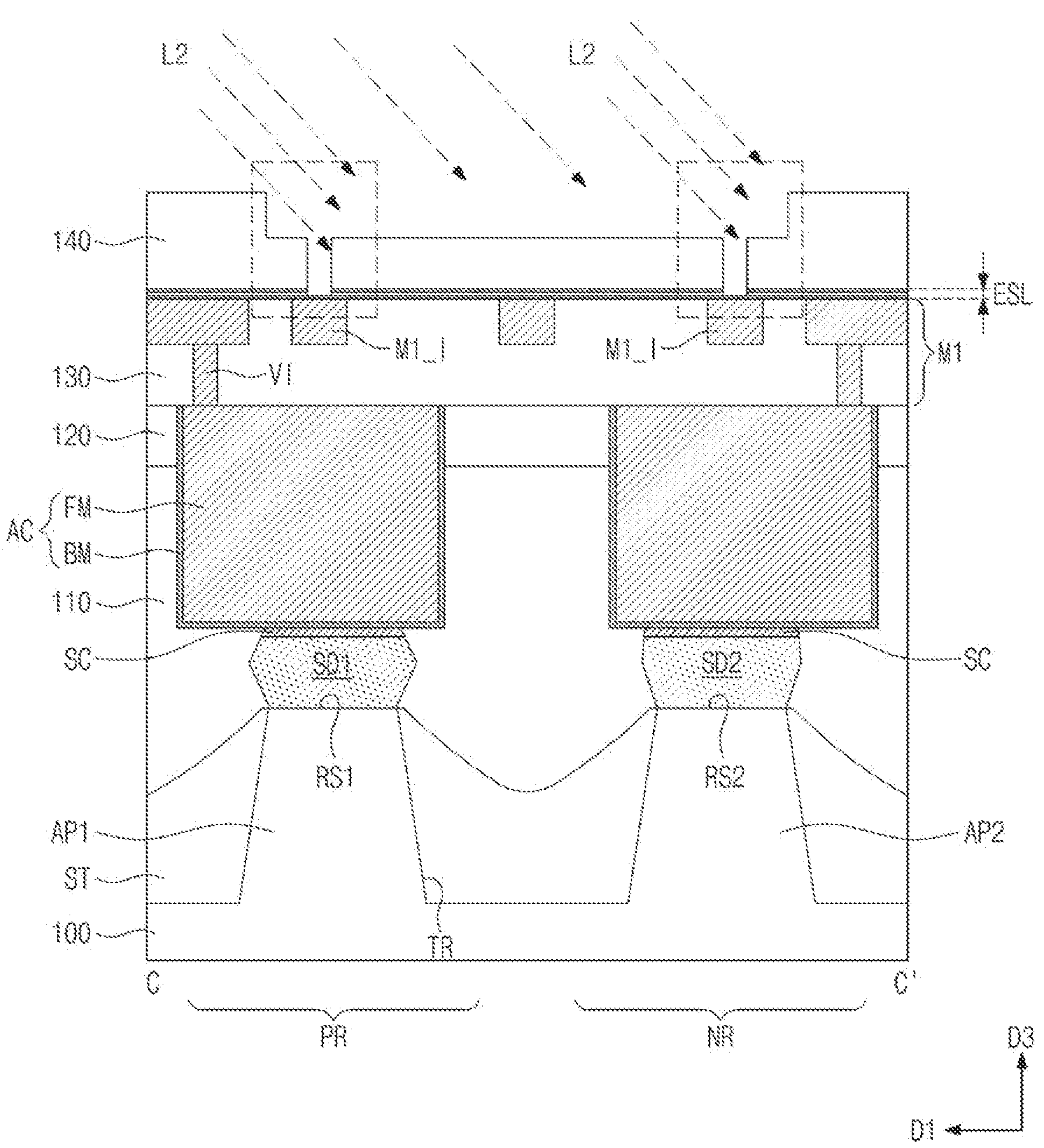
Figure 23:
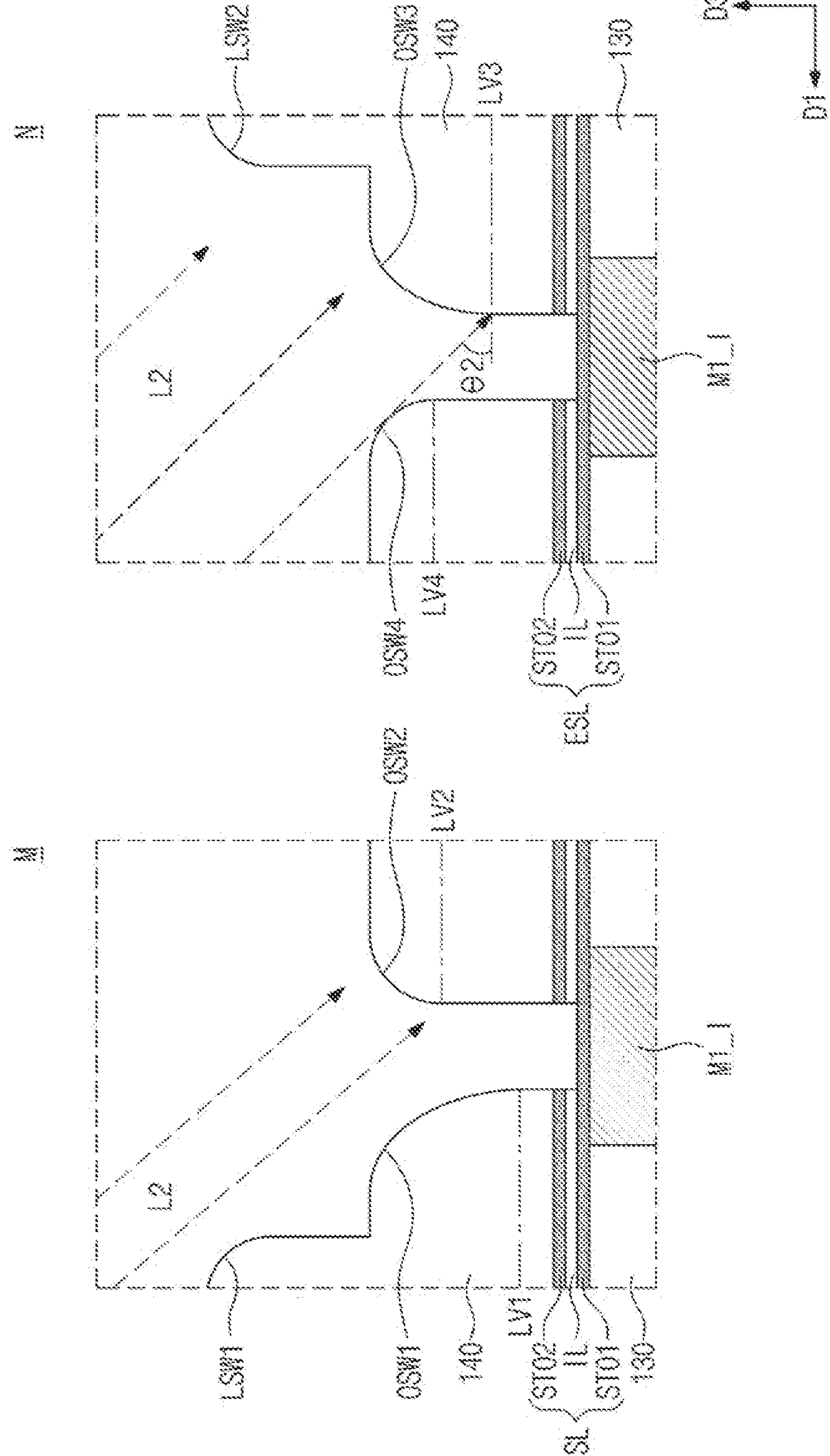
Figure 24:
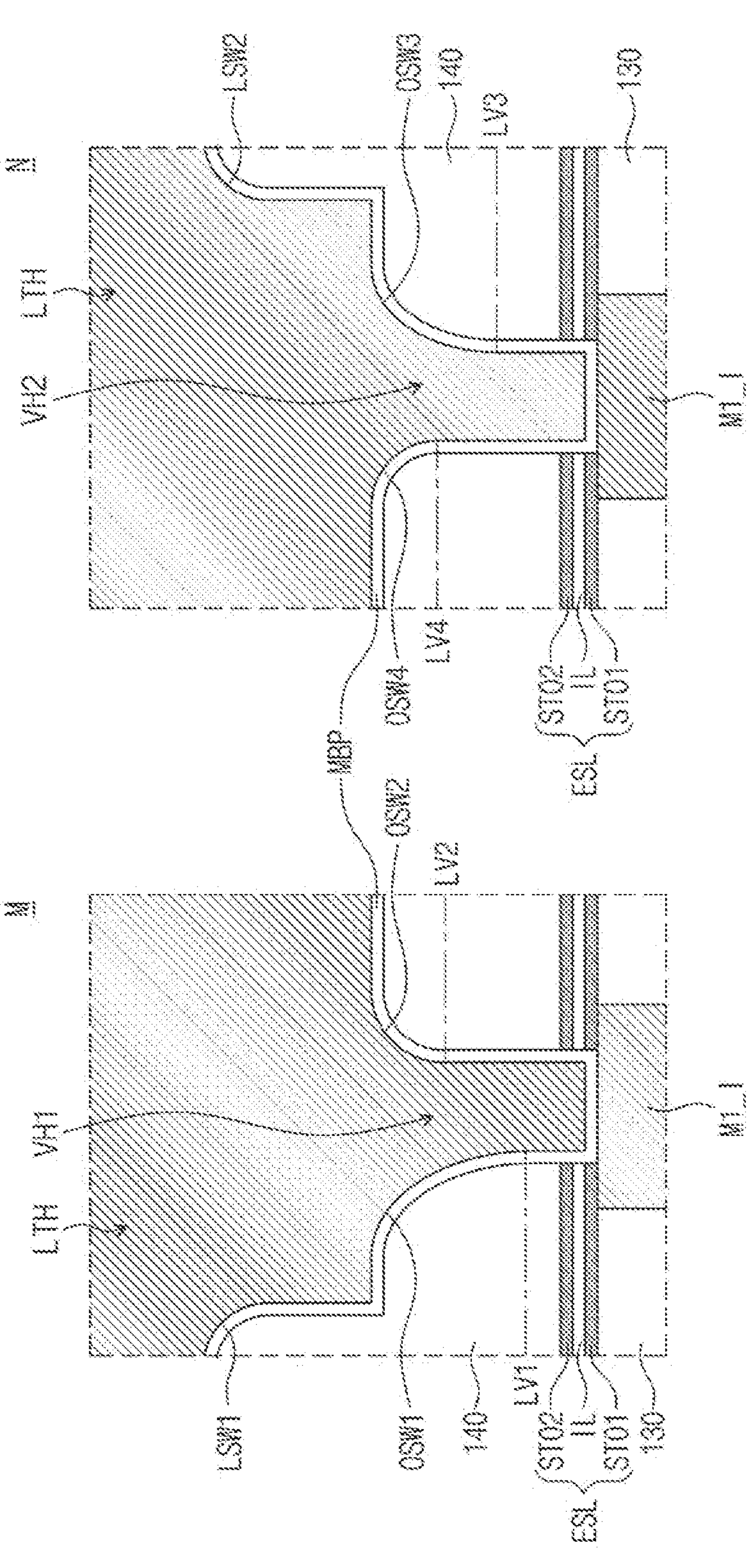

FIGS. 13 to 24 are views for illustrating the method of forming region 'M' and region 'N' of FIG. 5C. FIGS. 17, 18, and 19 are enlarged views illustrating region 'M' and region 'N' of FIG. 16. FIG. 21 is an enlarged view illustrating region 'M' and region 'N' of FIG. 20. FIG. 23 is an enlarged view illustrating region 'M' and region 'N' of FIG. 22.

Figure 13:
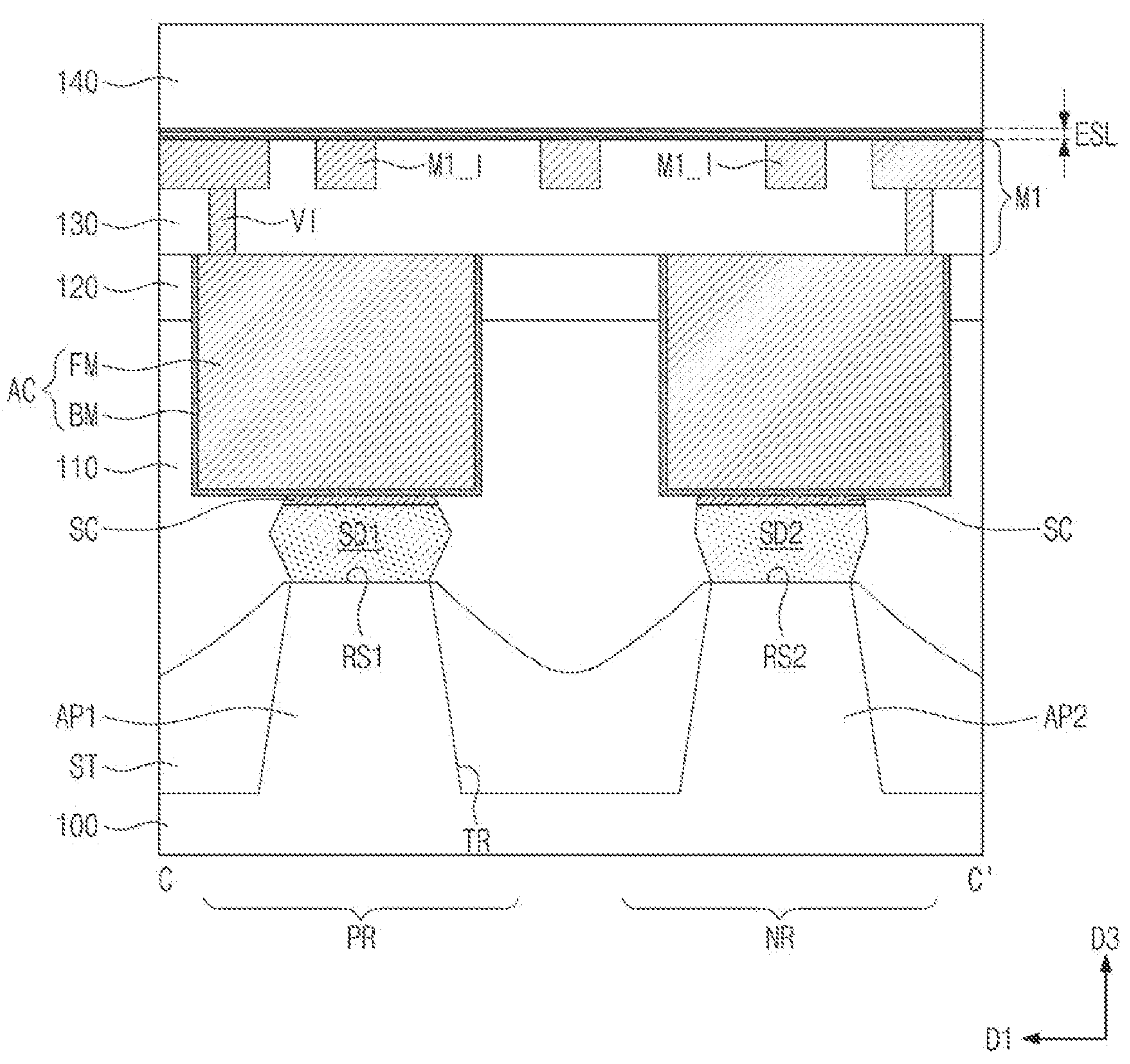
Figure 14:
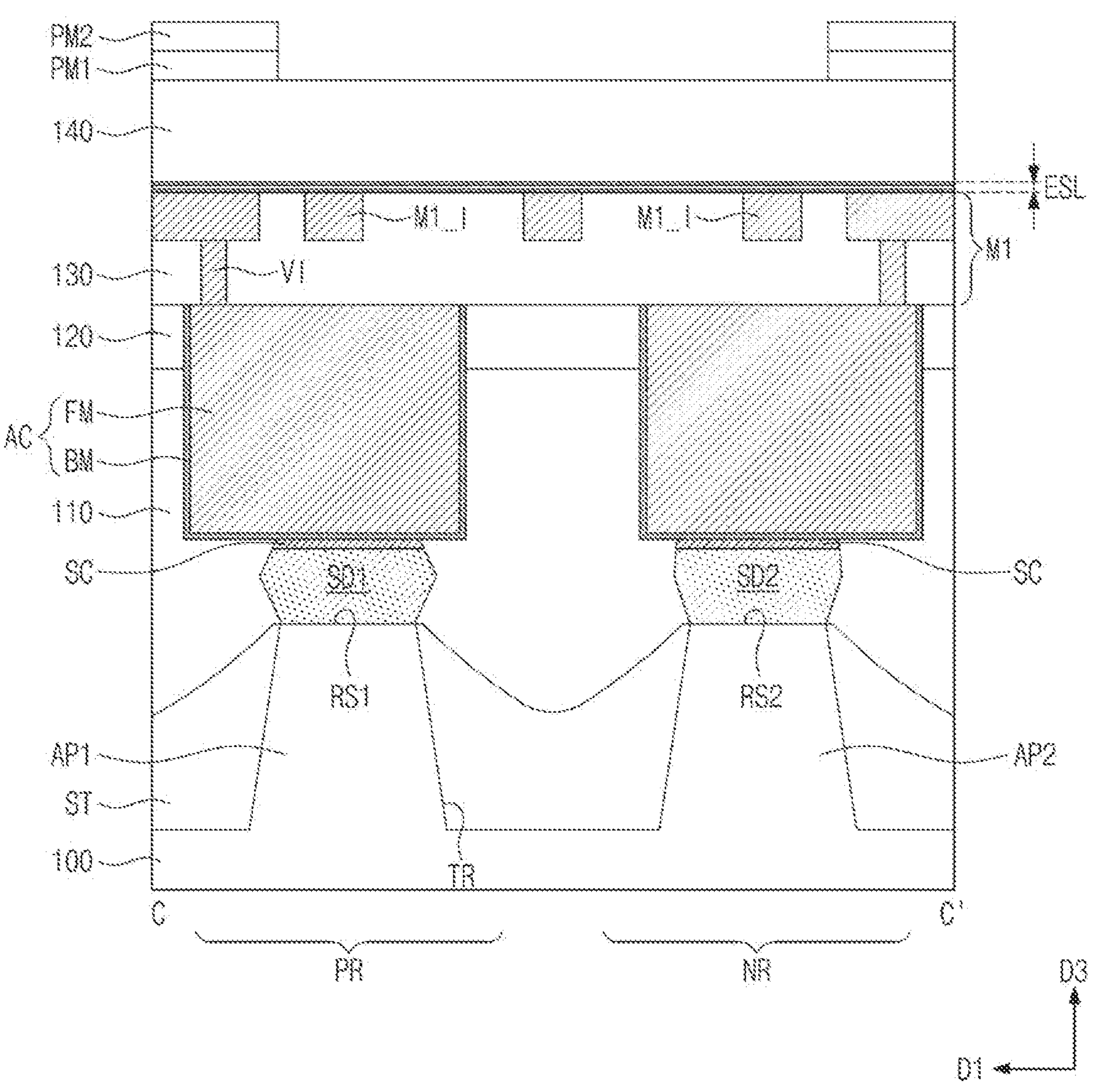

Referring to FIGS. 13 and 14, an etch stop layer ESL may be formed on the third interlayer insulating layer 130 and a fourth interlayer insulating layer 140 may be formed on the etch stop layer ESL. A first photomask pattern PM1 may be formed on the fourth interlayer insulating layer 140. A second photomask pattern PM2 may be formed on the first photomask pattern PM1. The first photomask pattern PM1 may include a material that may have an etch selectivity with respect to the second photomask pattern PM2. For example, the first photomask pattern PM1 may include TiN, and the second photomask pattern PM2 may include tetraethyl orthosilicate (TEOS).

Referring to FIG. 15, wiring holes UIH may be formed by patterning the fourth interlayer insulating layer 140. The wiring holes UIH may be formed using a photolithography process. Through the photolithography process, an upper portion of the fourth interlayer insulating layer 140 may be recessed.

Referring to FIGS. 16 and 17, a patterning process may be performed using the second photomask pattern PM2 as an etch mask. A line trench LTH and first and second via holes VH1 and VH2 may be formed through the patterning process. The line trench LTH may be formed by recessing the upper portion of the fourth interlayer insulating layer 140. The first and second via holes VH1 and VH2 may be formed by vertically recessing the wiring holes UIH. The first and second via holes VH1 and VH2 may expose an upper surface of the etch stop layer ESL. After the patterning process, the second photomask pattern PM2 may be removed.

Referring to FIG. 18, a second stop layer STO2 and the first photomask pattern PM1 exposed by the first and second via holes VH1 and VH2 may be removed. Referring to FIG. 19, an insulating layer IL exposed by the first and second via holes VH1 and VH2 may be removed. In this case, the first stop layer STO1 may not be removed.

Figure 20:
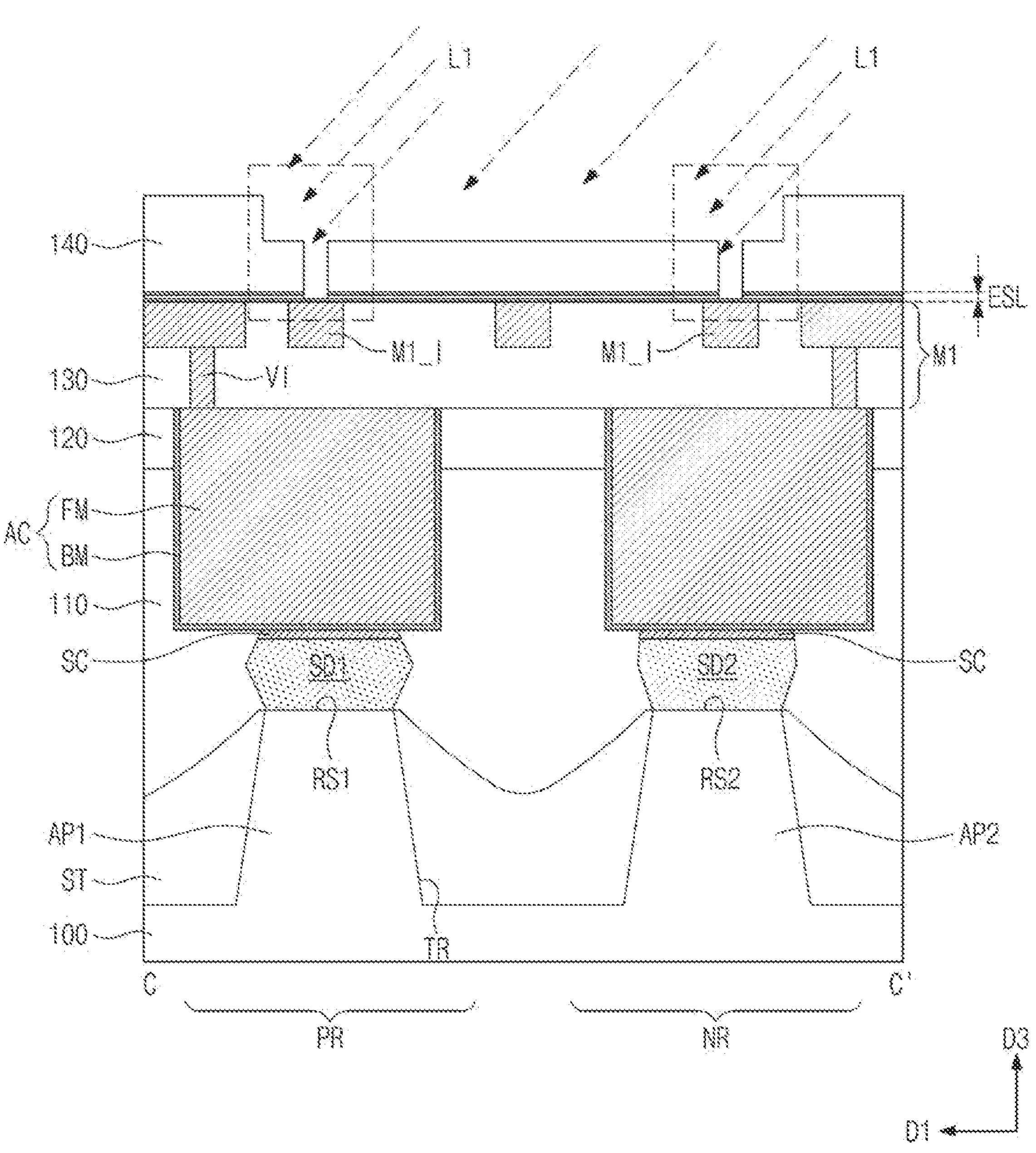

Referring to FIGS. 20 and 21, the fourth interlayer insulating layer 140 may be etched by a first etching process. The first etching process may be an ion beam sputter etching (IBE) process. A first incident light L1 containing ions having energy may be incident on the front surface of the substrate 100 at a first incident angle θ1. The first incident angle θ1 may be an acute angle formed by the first incident light L1 and the first direction D1.

In detail, the ions of the first incident light L1 may etch angled corners of the fourth interlayer insulating layer 140 into rounded shapes to form first and second line outer surfaces LSW1 and LSW2 and the first to fourth outer surfaces OSW1 to OSW4. The ions from the first incident light L1 may etch the fourth interlayer insulating layer 140 to form a curved first outer surface OSW1, and the lowest level of the first outer surface OSW1 may be the first level LV1. The first level LV1 may be a level at which a side surface of the first via structure VCS1 begins to be etched by the first incident light L1.

Outer surfaces whose normal vector has the same sign as a slope of the first incident light L1 may be etched more than outer surfaces having the opposite sign. That is, among both sides of the via structure VCS, a side facing the direction in which the first incident light L1 is incident may be etched more than the other side.

For example, the first outer surface OSW1 may be etched more and have a smaller curvature than the second outer surface OSW2. The fourth outer surface OSW4 may be etched more and may have a smaller curvature than the third outer surface OSW3. The first line outer surface LSW1 may be etched more and may have a smaller curvature than the second line outer surface LSW2.

By the first incident light L1, both outer surfaces OSW1 and OSW2 of the first via structure VCS1 may be etched more than both outer surfaces OSW3 and OSW4 of the second via structure VCS2. A difference in curvature between the first outer surface OSW1 and the second outer surface OSW2 may be greater than a difference in curvature between the third outer surface OSW3 and the fourth outer surface OSW4.

Referring to FIGS. 22 and 23, the fourth interlayer insulating layer 140 may be etched by a second etching process. The second etching process may be an ion beam sputter etching (IBE) process. A second incident light L2 containing ions having energy may be incident on the front surface of the substrate 100 at a second incident angle θ2. The second incident angle θ2 may be an acute angle formed by the second incident light L2 and the first direction D1. A slope of the second incident light L2 may have a different sign from the slope of the first incident light L1.

Etching the fourth interlayer insulating layer 140 by the second incident light L2 may be the same as the etching of the fourth interlayer insulating layer 140 by the first incident light L1. However, the second incident light L2 may have lower energy than the first incident light L1.

Ions of the second incident light L2 may etch the first and second line outer surfaces LSW1 and LSW2 and the first to fourth outer surfaces OSW1 to OSW4. Due to the second incident light L2, a curvature of each of the first and second line outer surfaces LSW1 and LSW2 and the first to fourth outer surfaces OSW1 to OSW4 may be further reduced.

Outer surfaces whose normal vector has the same sign as the slope of the second incident light L2 may be etched more than outer surfaces having the opposite sign. That is, among both sides of the via structure VCS, a side facing the direction in which the second incident light L2 is incident may be etched more than the other side.

For example, the third outer surface OSW3 may be etched more and have a smaller curvature than the fourth outer surface OSW4. However, because the second incident light L2 has lower energy than the first incident light L1, the curvature of the second outer surface OSW2 may still be greater than the curvature of the first outer surface OSW1.

The lowest level of the third outer surface OSW3 may be the third level LV3. That is, the third level LV3 may be a level where a side of the second via structure VCS2 begins to be etched by the second incident light L2. However, because the second incident light L2 has lower energy than the first incident light L1, the third level LV3 may be higher than the first level LV1.

Referring again to FIGS. 24 and 6, the first stop layer STO1 exposed to the first and second via holes VH1 and VH2 may be removed. An upper wiring M2_UL may be formed by filling the line trench LTH and the first and second via holes VH1 and VH2 with a conductive material. In detail, forming the upper wiring M2_UL may include forming a barrier layer MBP in the line trench LTH and the first and second via holes VH1 and VH2, forming a via structure VCS in the wiring hole VH, and forming a line structure LCS in the line trench LTH.

The upper wiring M2_UL may include at least one metal selected from aluminum, copper, tungsten, molybdenum, and cobalt. The barrier layer MBP may include a metal layer/metal nitride layer. The metal layer may include at least one of titanium, tantalum, tungsten, nickel, cobalt, and platinum. The metal nitride layer may include at least one of titanium nitride (TiN), tantalum nitride (TaN), tungsten nitride (WN), nickel nitride (NiN), cobalt nitride (CoN), and platinum nitride (PtN). According to the present embodiment, the upper wirings M2_UL may be formed through a dual damascene process.

According to the manufacturing method of the disclosure, the etching process for forming the first outer surface OSW1 and the second outer surface OSW2 may be performed separately. The first and second incident lights L1 and L2 do not enter perpendicularly on the front surface of the substrate 100, but enter at incident angles θ1 and θ2. Therefore, the first stop layer STO1 and the first wiring M1_1 may be prevented from being etched or denatured by the first and second incident lights L1 and L2.

Figure 25:
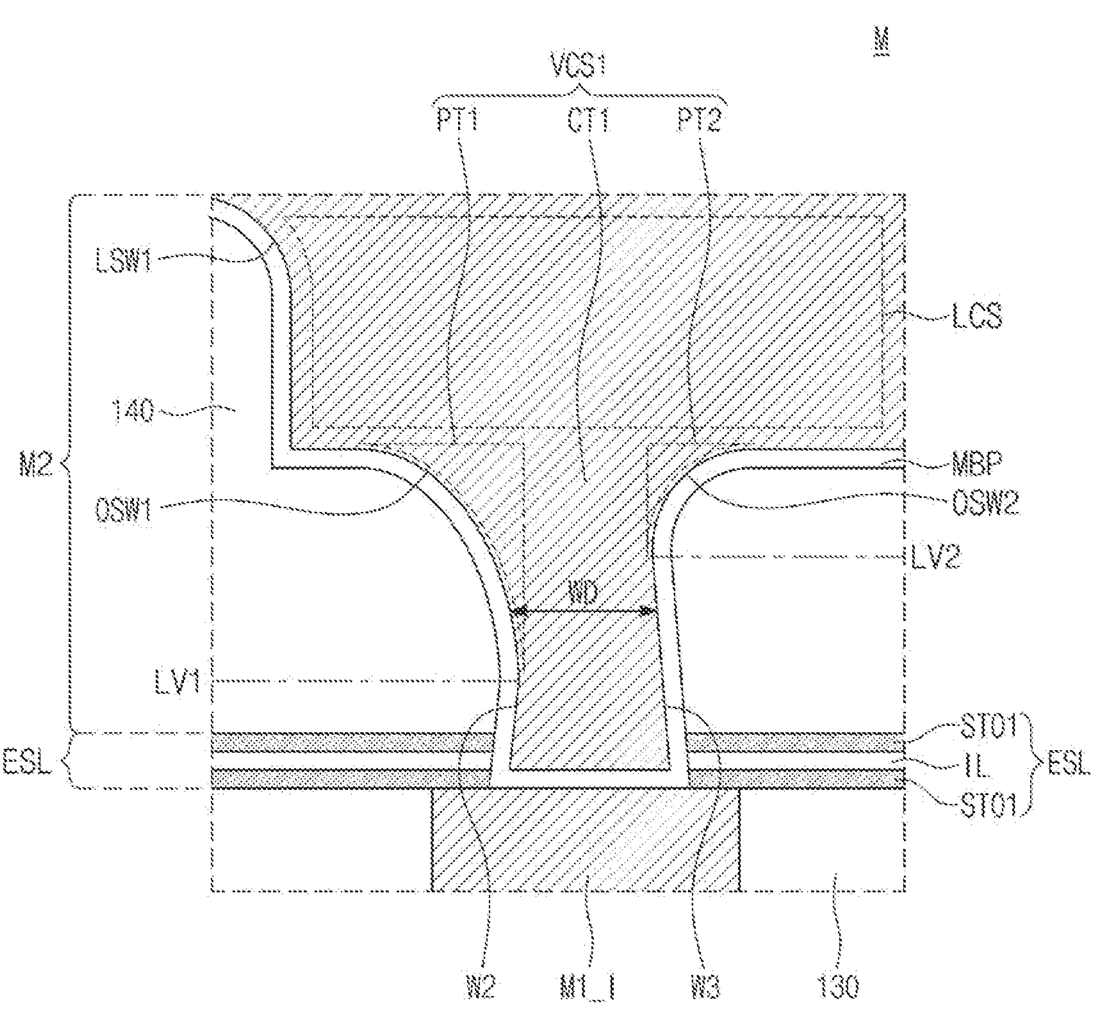
FIG. 25 is a view for illustrating a semiconductor device according to an alternative embodiment of FIG. 6.

FIG. 25 is an enlarged view of region 'M' and region 'N' of FIG. 6 to illustrate a semiconductor device according to other embodiments of the disclosure. In this embodiment, detailed descriptions of technical features overlapping with those previously described with reference to FIGS. 5C and 6 will be omitted, and differences will be described in detail.

Referring to FIG. 25, a width of the first via structure VCS1 may decrease and then increase from an upper surface to a lower surface of the first via structure VCS1. Second and third surfaces W2 and W3 of the first via structure VCS1 may form an acute angle with the first wiring M1_1. The fourth interlayer insulating layer 140 may be depressed toward the first via structure VCS1 at the first level LV1 and the second level LV2. This is because, in the manufacturing process of FIGS. 20 to 23, the lower portions of both sides of the first via hole VH1 are etched by the first and second incident lights L1 and L2.

As the lower side of the first via hole VH1 is etched, the amount of metal material filled in the first via hole VH1 may increase. Accordingly, a size of the first via structure VCS1 may increase and a resistance thereof may decrease.

In the semiconductor device according to the disclosure, the via structure of the wiring may include the first outer surface and the second outer surface, wherein the first and second outer surfaces are curved surfaces, and the curvature of the first outer surface and the curvature of the second outer surface may be different from each other. The etching process for forming the first outer surface and the etching process for forming the second outer surface may be performed separately. In this case, the ion beam etching process (IBE) may be used, and the ions may be provided at the incident angle, thereby preventing the lower wiring from being damaged by the etching process. As a result, the electrical characteristics of the semiconductor device according to the disclosure may be improved.

While embodiments are described above, a person skilled in the art may understand that many modifications and variations are made without departing from the spirit and scope of the disclosure defined in the following claims. Accordingly, the example embodiments of the disclosure should be considered in all respects as illustrative and not restrictive, with the spirit and scope of the disclosure being indicated by the appended claims.

What is claimed is:

1. A semiconductor device comprising:

a transistor on a substrate;

a first wiring layer on the transistor, the first wiring layer comprising a first wiring electrically connected to the transistor; and a second wiring layer on the first wiring layer, the second wiring layer comprising an interlayer insulating layer and a second wiring provided in the interlayer insulating layer, wherein the second wiring comprises a line structure and a first via structure, wherein the first via structure vertically connects the line structure and the first wiring, wherein the first via structure comprises:

a first outer surface in contact with the interlayer insulating layer; and a second outer surface in contact with the interlayer insulating layer and facing a direction opposite from the first outer surface, wherein the first outer surface and the second outer surface are curved surfaces, and wherein a curvature of the first outer surface and a curvature of the second outer surface are different from each other.

2. The semiconductor device of claim 1, wherein the first via structure further comprises:

a first portion in contact with the interlayer insulating layer on the first outer surface; and a second portion in contact with the interlayer insulating layer on the second outer surface, and wherein a lowest level of the first portion is lower than a lowest level of the second portion.

3. The semiconductor device of claim 1, wherein a width of the first via structure decreases toward a lower surface of the first via structure.

4. The semiconductor device of claim 1, wherein a width of the first via structure decreases and then increases toward a lower surface of the first via structure.

5. The semiconductor device of claim 1, wherein a curvature of the first outer surface and a curvature of the second outer surface decrease toward an upper portion of the first via structure.

6. The semiconductor device of claim 1, further comprising an etch stop layer between the first wiring layer and the second wiring layer, wherein the etch stop layer comprises a first stop layer, a second stop layer, and an insulating layer between the first stop layer and the second stop layer.

7. The semiconductor device of claim 1, wherein the line structure comprises:

a first line outer surface that is in contact with the interlayer insulating layer and is curved; and a second line outer surface that is in contact with the interlayer insulating layer, is curved, and faces in a direction opposite from the first line outer surface, and wherein a curvature of the first line outer surface and a curvature of the second line outer surface are different from each other.

8. The semiconductor device of claim 1, wherein the second wiring further comprises a second via structure connected to the line structure and adjacent to the first via structure, wherein the second via structure comprises:

a third outer surface in contact with the interlayer insulating layer; and a fourth outer surface in contact with the interlayer insulating layer and facing in a direction opposite from the third outer surface, and wherein a curvature of the first outer surface is smaller than a curvature of the third outer surface.

9. The semiconductor device of claim 8, wherein a curvature of the fourth outer surface is greater than a curvature of the second outer surface.

10. The semiconductor device of claim 8, wherein a normal vector of each of the first outer surface and the fourth outer surface has a positive slope, and wherein a normal vector of each of the second outer surface and the third outer surface has a negative slope.

11. A semiconductor device comprising:

a transistor on a substrate;

a first wiring layer on the transistor, the first wiring layer comprising a first wiring electrically connected to the transistor; and a second wiring layer on the first wiring layer, the second wiring layer comprising an interlayer insulating layer and a second wiring provided in the interlayer insulating layer, wherein the second wiring comprises a line structure and a first via structure, wherein the first via structure connects the line structure and the first wiring in a first direction, wherein the via structure comprises:

a first portion in contact with a first surface of the interlayer insulating layer; and a second portion in contact with a second surface of the interlayer insulating layer, the second surface facing the first surface, and the second portion spaced apart from the first portion in a second direction perpendicular to the first direction, wherein the first surface and the second surface are curved surfaces, and wherein a lowest level of the first portion is lower than a lowest level of the second portion.

12. The semiconductor device of claim 11, wherein a curvature of the second surface is greater than a curvature of the first surface.

13. The semiconductor device of claim 11, wherein a width of the via structure decreases in a direction moving toward the first wiring.

14. The semiconductor device of claim 11, wherein a curvature of each of the first surface and the second surface increases in a direction moving toward the line structure.

15. The semiconductor device of claim 11, further comprising an etch stop layer between the first wiring layer and the second wiring layer, wherein the etch stop layer comprises a first stop layer, a second stop layer, and an insulating layer between the first stop layer and the second stop layer.

16. A semiconductor device comprising:

a transistor on a substrate;

a first wiring layer on the transistor, the first wiring layer comprising a first wiring electrically connected to the transistor;

a second wiring layer on the first wiring layer, the second wiring layer comprising an interlayer insulating layer and a second wiring provided in the interlayer insulating layer; and an etch stop layer interposed between the first wiring layer and the second wiring layer, wherein the second wiring comprises:

a line structure provided on an upper portion of the second wiring layer; and a plurality of via structures vertically connecting the line structure and the first wiring, wherein the plurality of via structures comprise first via structures and second via structures adjacent to each other, wherein the first via structure comprises:

a first outer surface comprising a curved surface in contact with the interlayer insulating layer; and a second outer surface comprising a curved surface in contact with the interlayer insulating layer and facing a direction opposite from the first outer surface, wherein the second via structure comprises:

a third outer surface comprising a curved surface in contact with the interlayer insulating layer; and a fourth outer surface comprising a curved surface in contact with the interlayer insulating layer and facing in a direction opposite from the third outer surface, and wherein a curvature of the first outer surface is different from a curvature of the third outer surface.

17. The semiconductor device of claim 16, wherein a curvature of the fourth outer surface is different from a curvature of the second outer surface.

18. The semiconductor device of claim 16, wherein a normal vector of each of the first outer surface and the fourth outer surface have a positive slope, and wherein a normal vector of each of the second outer surface and the third outer surface have a negative slope.

19. The semiconductor device of claim 16, wherein a width of each of the first via structure and the second via structure decreases in a direction toward the first wiring.

20. The semiconductor device of claim 16, wherein the curvature of the first outer surface is smaller than the curvature of the second outer surface, and wherein the curvature of the third outer surface is smaller than the curvature of the fourth outer surface.

* * * * *